(12) United States Patent
Hwang

(10) Patent No.: US 7,601,018 B2
(45) Date of Patent: Oct. 13, 2009

(54) BGA-TYPE TEST AND BURN-IN SOCKET FOR INTEGRATED CIRCUITS (ICS)

(76) Inventor: Dong Weon Hwang, #78-1203, Hyundau Apt., 456 Apgujeong-dong, Gangnam-gu, Seoul (KR) 135-110

( * ) Notice: Subject to any disclaimer, the term of this patent is extended or adjusted under 35 U.S.C. 154(b) by 10 days.

(21) Appl. No.: 11/813,518

(22) PCT Filed: Jan. 9, 2006

(86) PCT No.: PCT/KR2006/000076

§ 371 (c)(1),
(2), (4) Date: Jul. 9, 2007

(87) PCT Pub. No.: WO2006/075855

PCT Pub. Date: Jul. 20, 2006

(65) Prior Publication Data

US 2008/0207036 A1     Aug. 28, 2008

(51) Int. Cl.
*H01R 13/62* (2006.01)
(52) U.S. Cl. ...................................... 439/331
(58) Field of Classification Search ................ 439/331, 439/71, 73, 268; 324/755; 257/727
See application file for complete search history.

(56) References Cited

U.S. PATENT DOCUMENTS

| | | | | |
|---|---|---|---|---|
| 6,027,355 A | * | 2/2000 | Ikeya | 439/268 |
| 6,139,348 A | * | 10/2000 | Fukunaga | 439/266 |
| 6,402,537 B2 | * | 6/2002 | Ikeya | 439/259 |
| 6,537,093 B2 | * | 3/2003 | Kanesashi et al. | 439/268 |
| 6,614,247 B2 | * | 9/2003 | Ikeya et al. | 324/755 |
| 6,666,691 B2 | * | 12/2003 | Ikeya | 439/71 |

\* cited by examiner

*Primary Examiner*—Alexander Gilman
(74) *Attorney, Agent, or Firm*—Adam K. Sacharoff; Much Shelist

(57) ABSTRACT

Disclosed herein is a BGA-type test and burn-in socket for ICs. The socket includes contacts, a socket body, a cover, a slide, and an IC holder. The socket body has contact holes to receive the contacts, and positioning pins to secure the socket body to a PCB. A stopper, receiving a contact body, and a lead guide, guiding a contact lead, are provided on the lower portion of the socket body, and the slide and the cover are provided on the upper portion of the socket body. The cover includes holder rotating pins, and open cams and closure cams to move the slide. The slide includes open cam contact parts contacting the open cams when the cover is pressed down, and closure cam contact parts contacting the closure cams when the cover moves upwards. The IC holder moves downwards by the holder rotating pins, thus pressing an IC.

16 Claims, 24 Drawing Sheets

[Fig. 1]
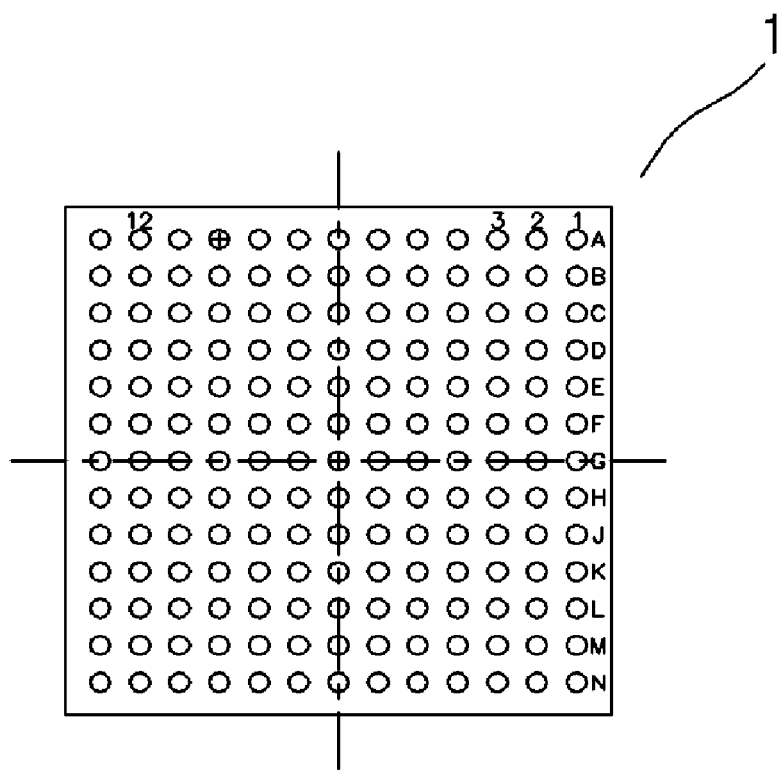
[Fig. 2]
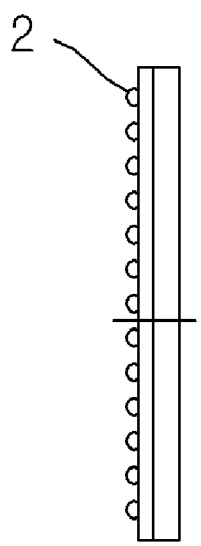

[Fig. 3]
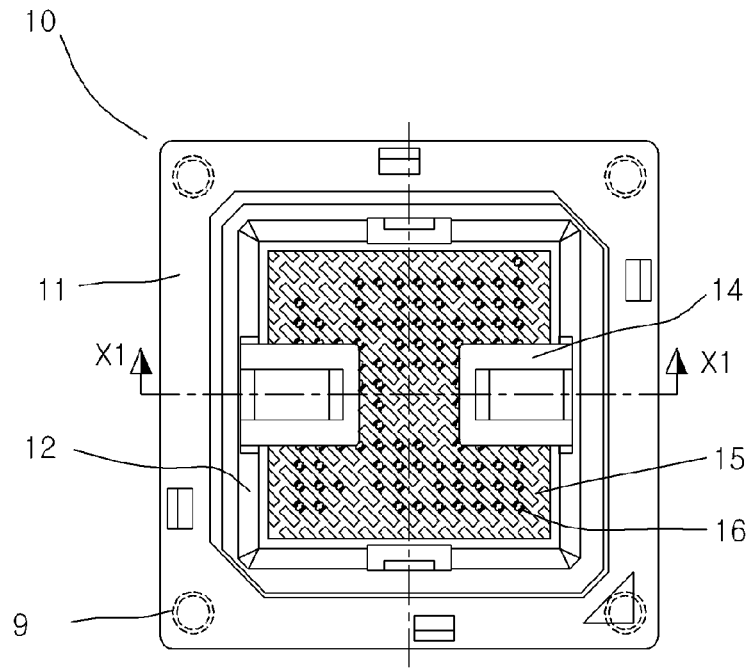
[Fig. 4]
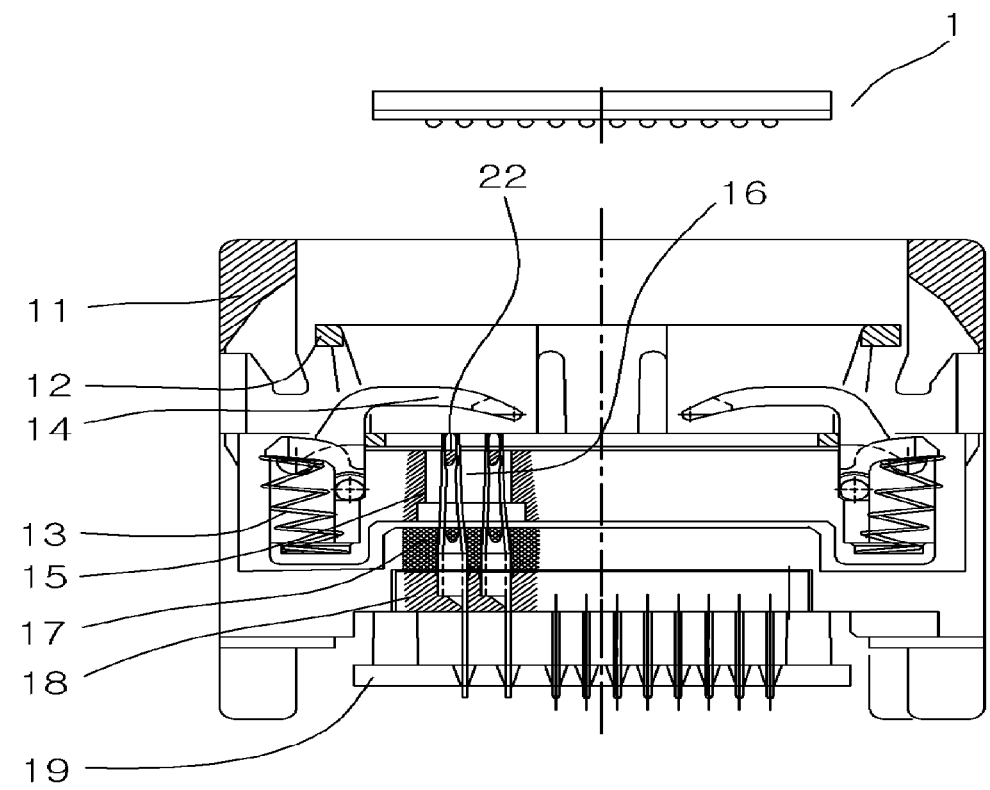

[Fig. 5]
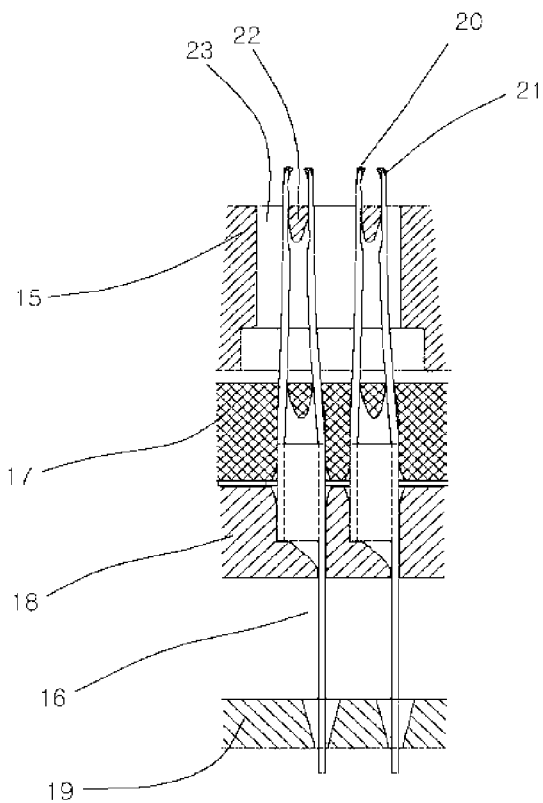
[Fig. 6]
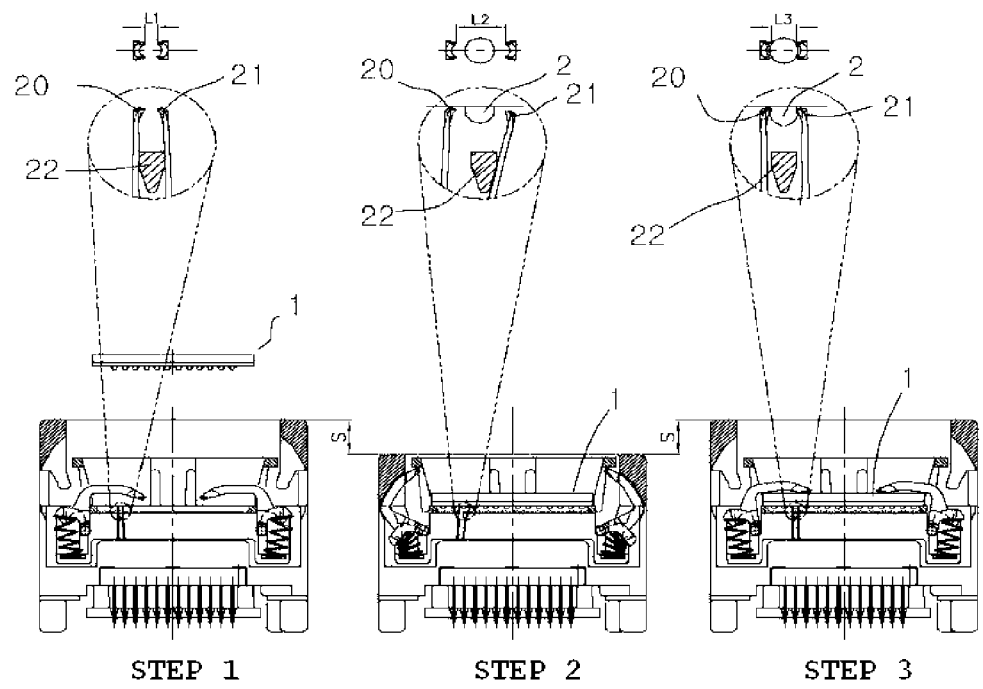
STEP 1  STEP 2  STEP 3

[Fig. 7]
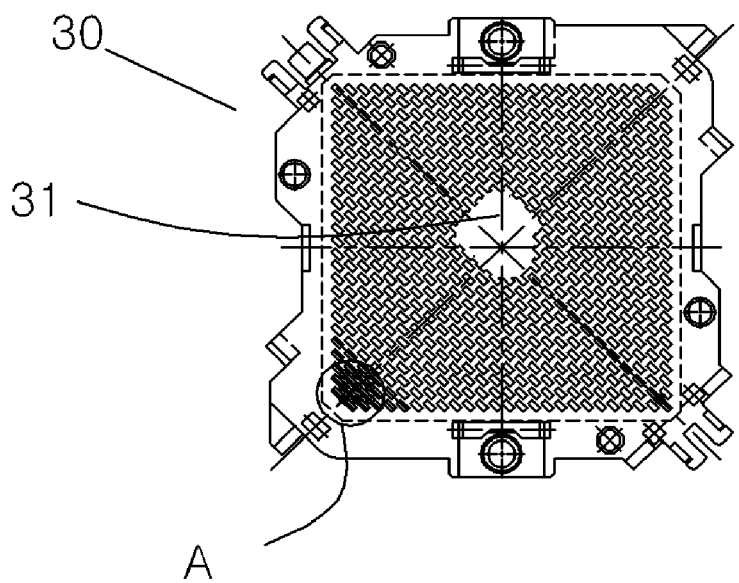
[Fig. 8]
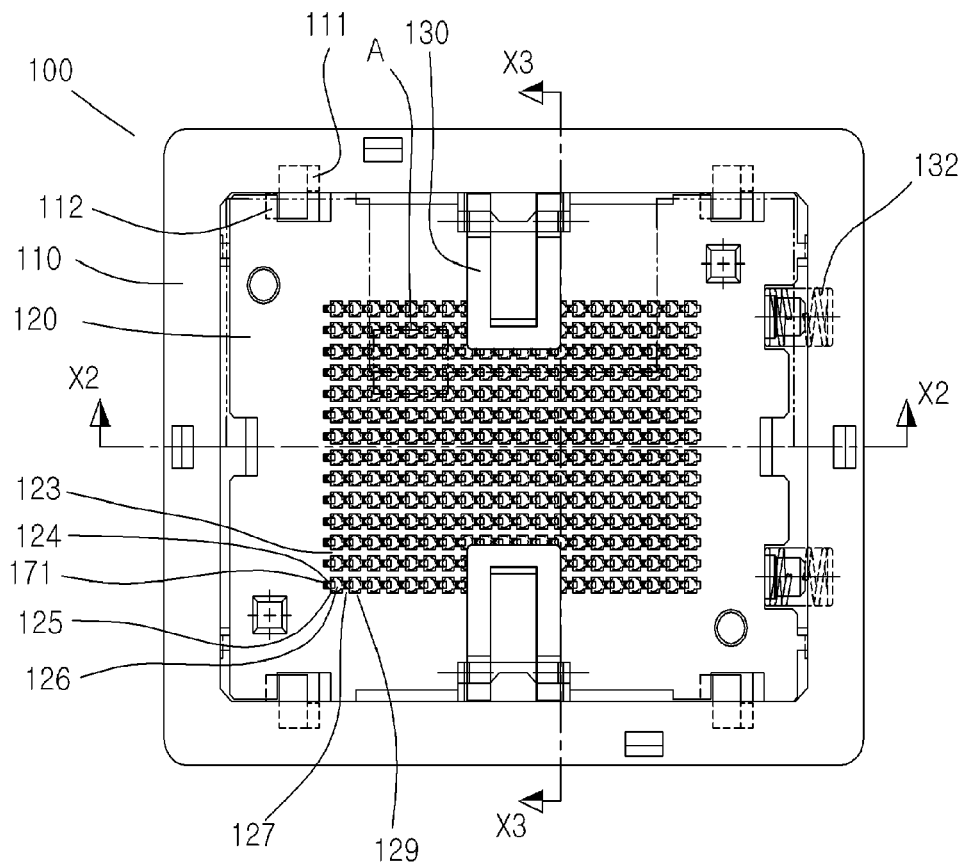

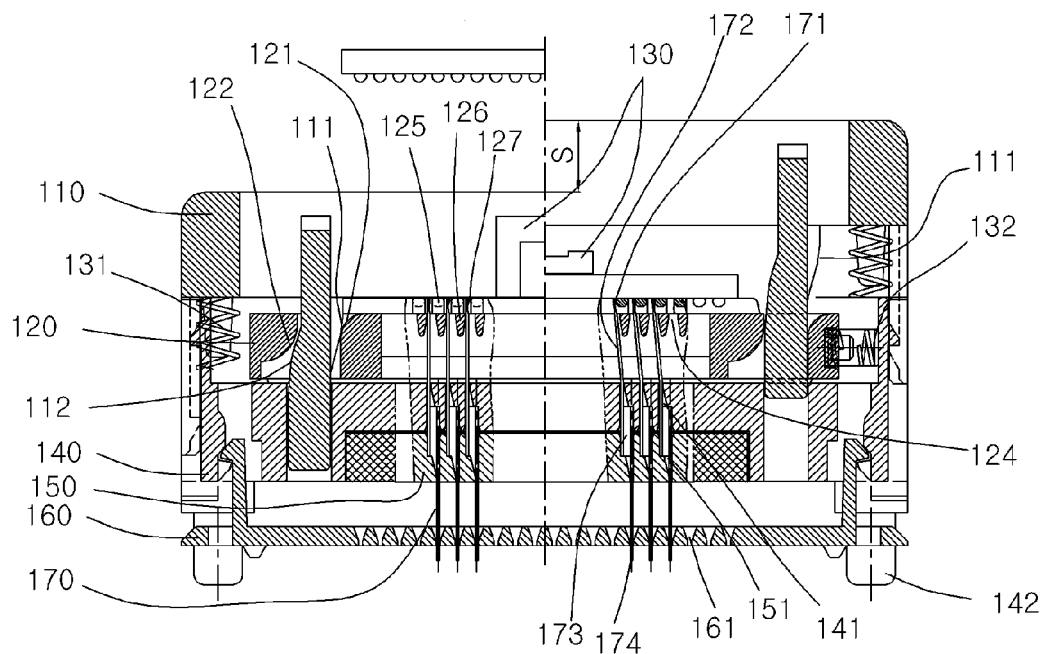
[Fig. 9]
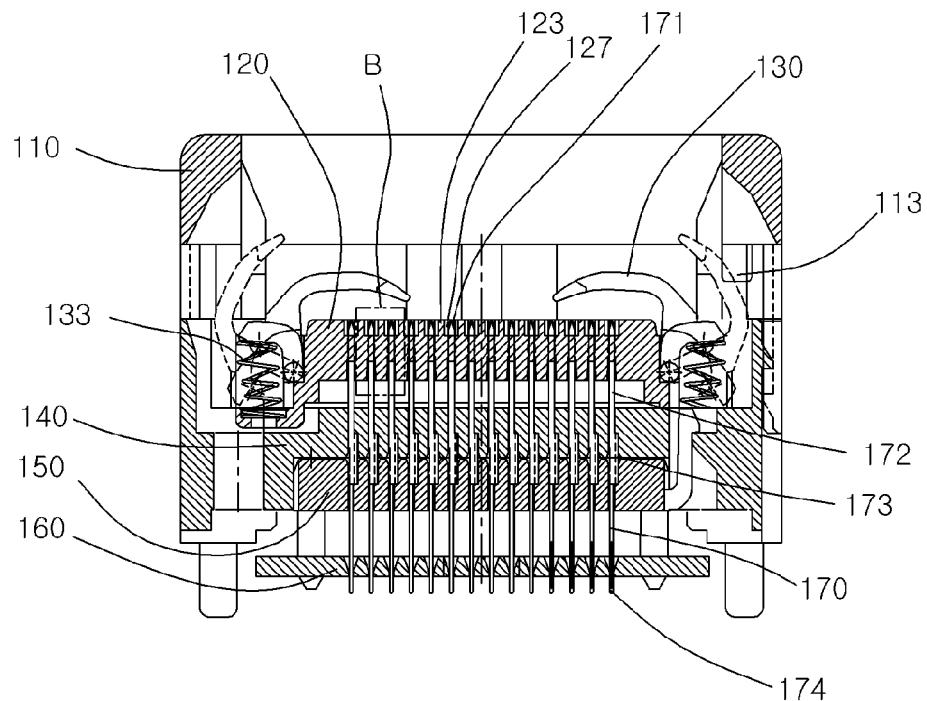
[Fig. 10]

[Fig. 11]
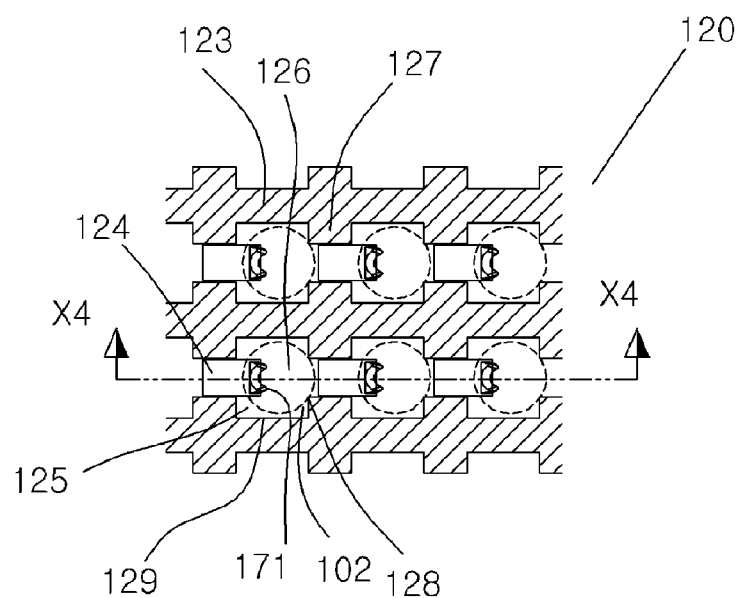
[Fig. 12]
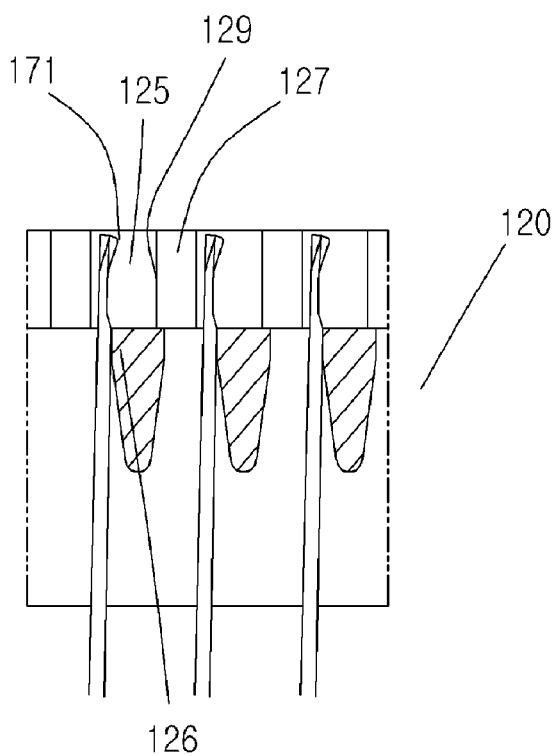

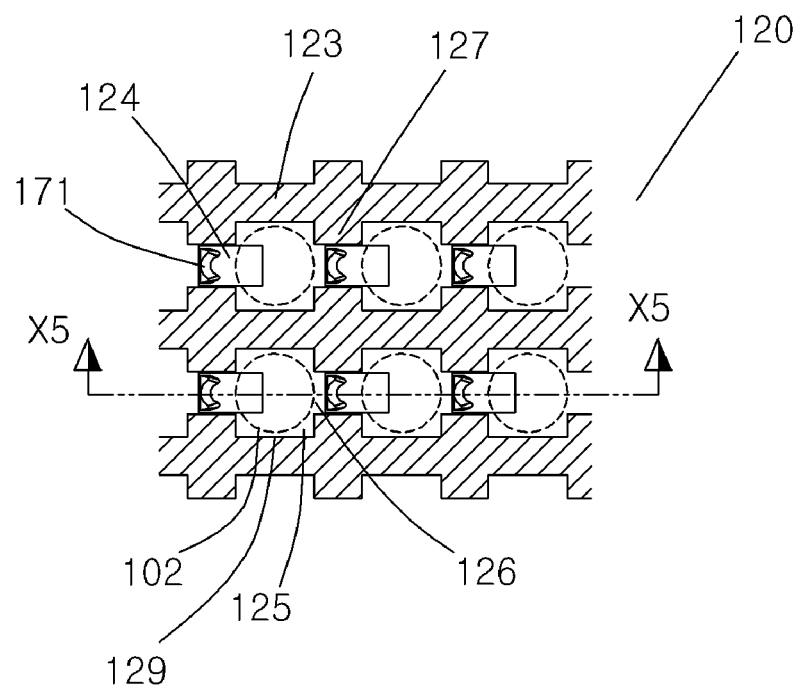
[Fig. 13]
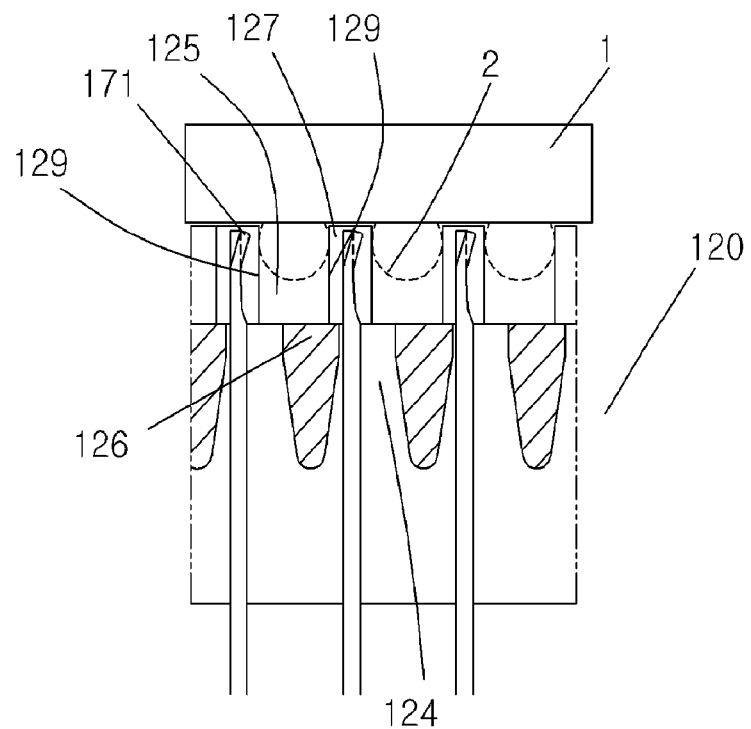
[Fig. 14]

[Fig. 15]
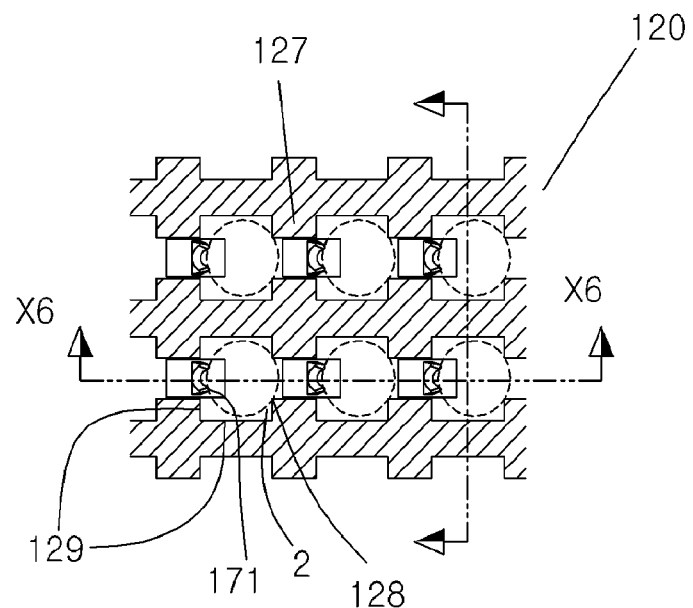
[Fig. 16]
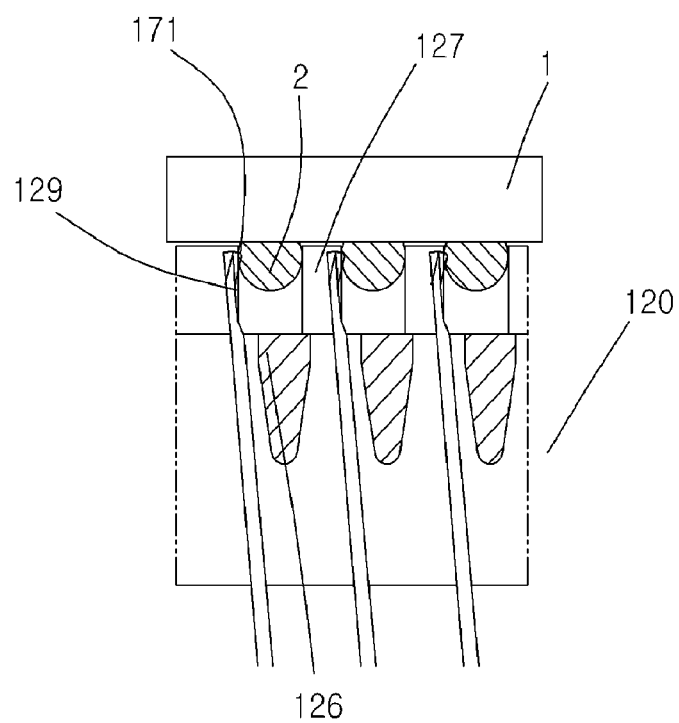

[Fig. 17]
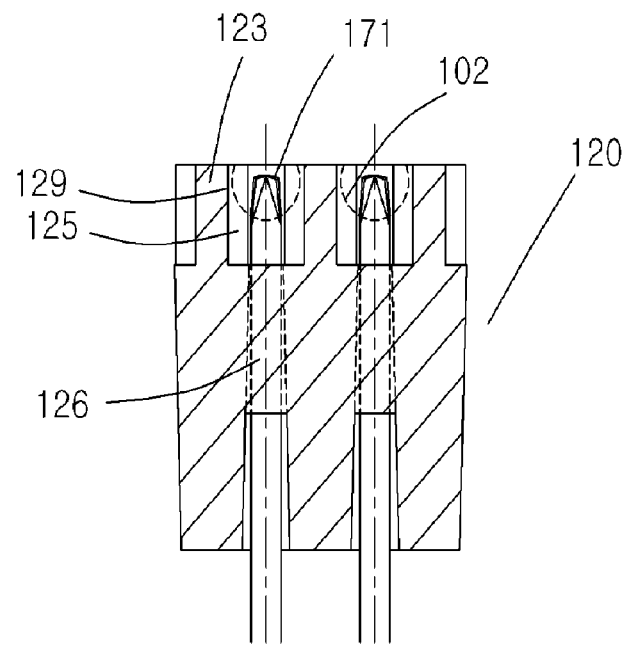
[Fig. 18]
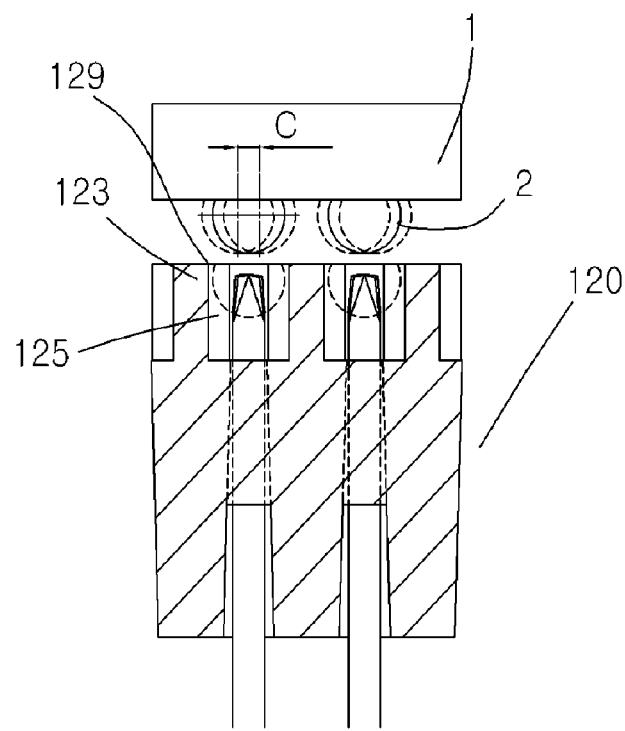

[Fig. 19]
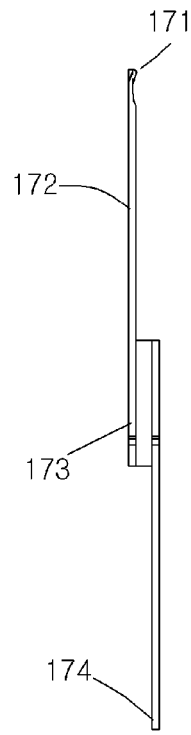
[Fig. 20]
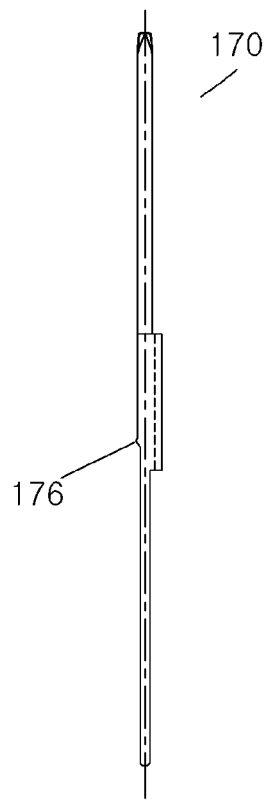

[Fig. 21]
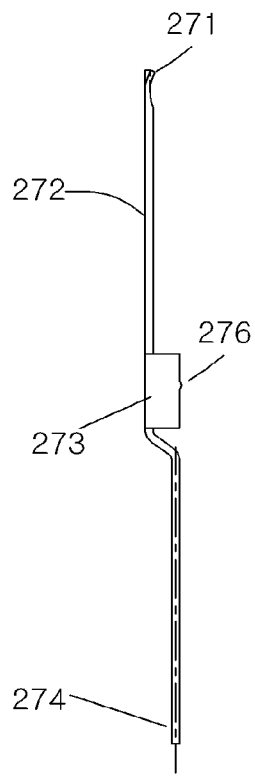
[Fig. 22]
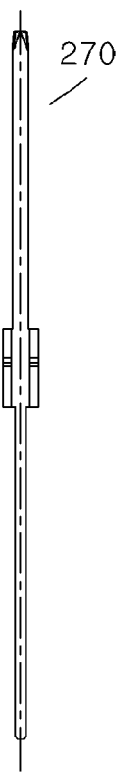

[Fig. 23]
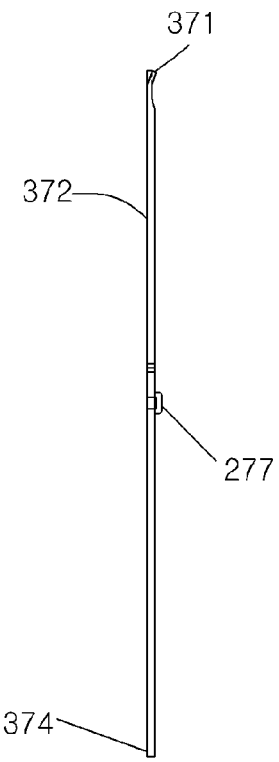
[Fig. 24]
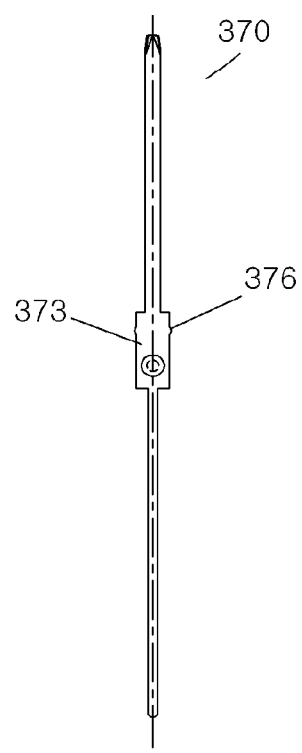

[Fig. 25]
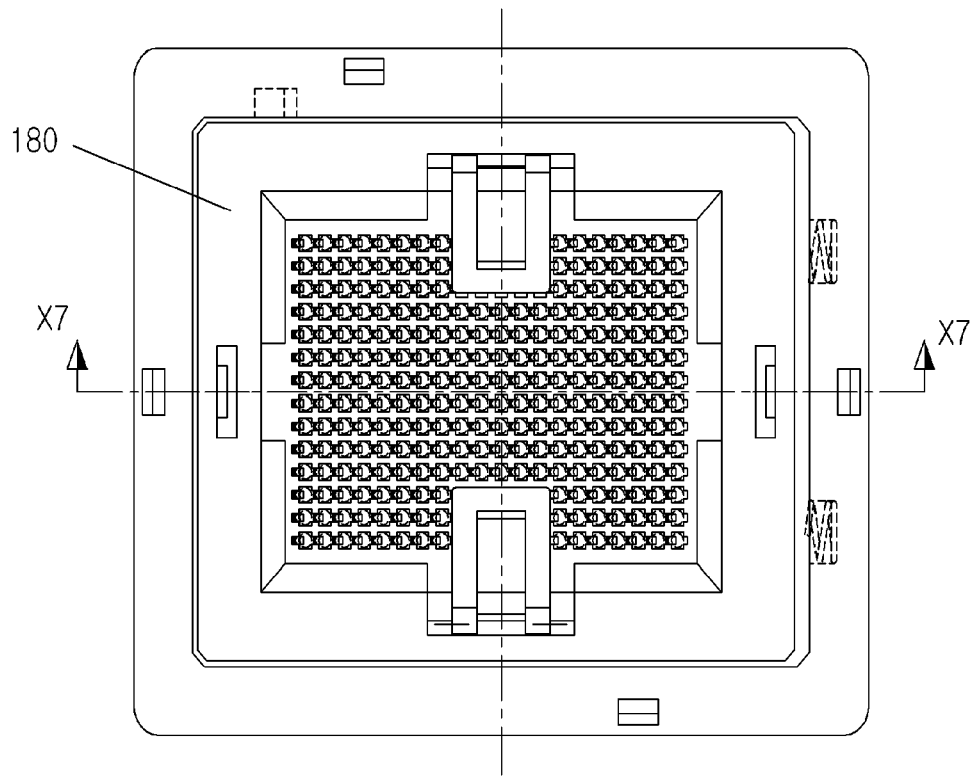
[Fig. 26]
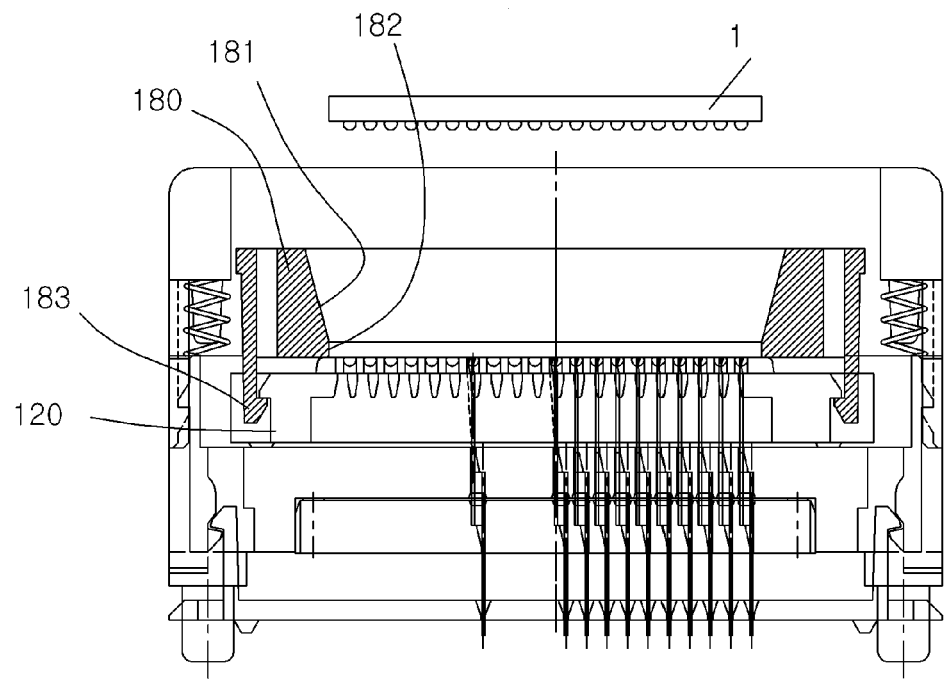

[Fig. 27]
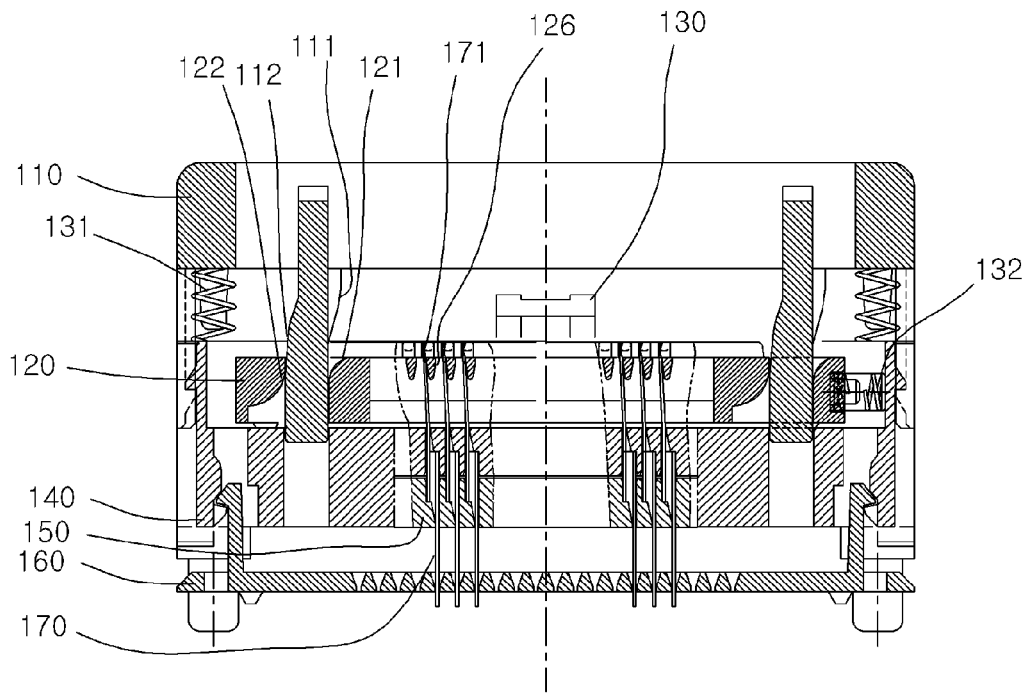
[Fig. 28]
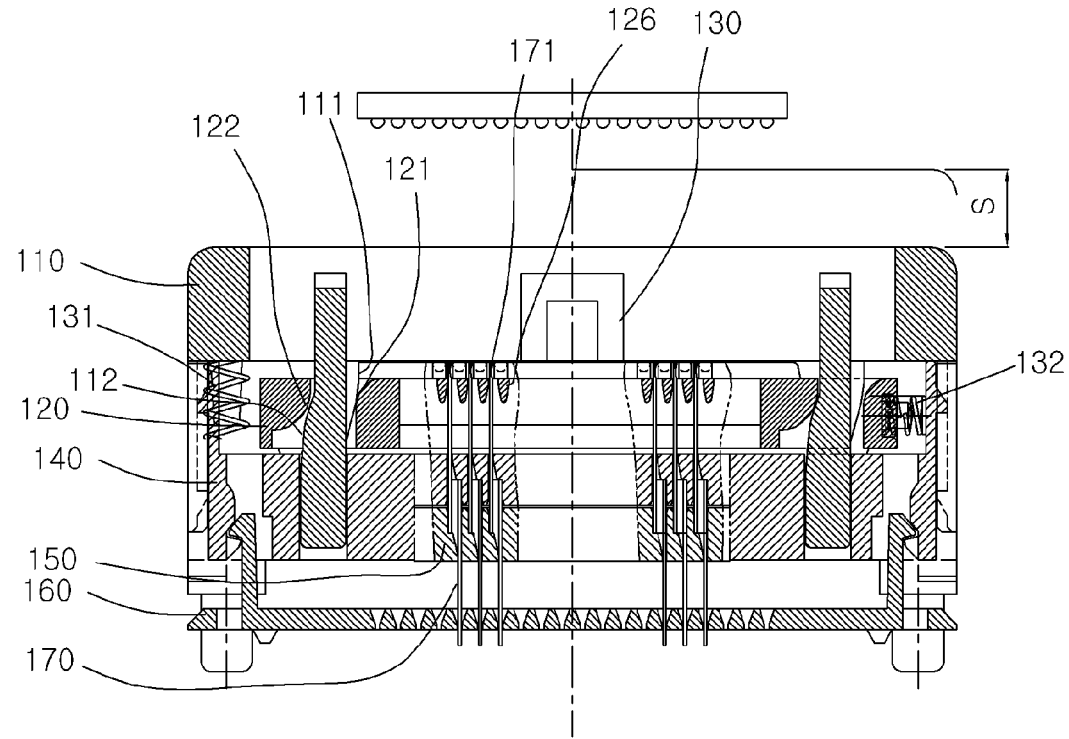

[Fig. 29]
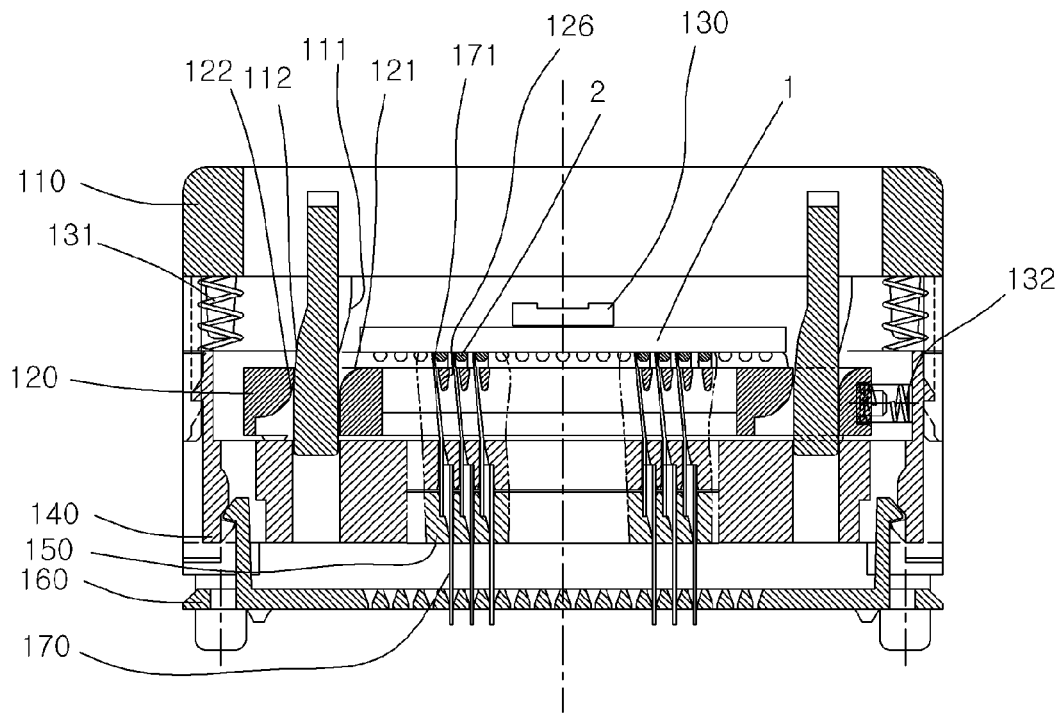
[Fig. 30]
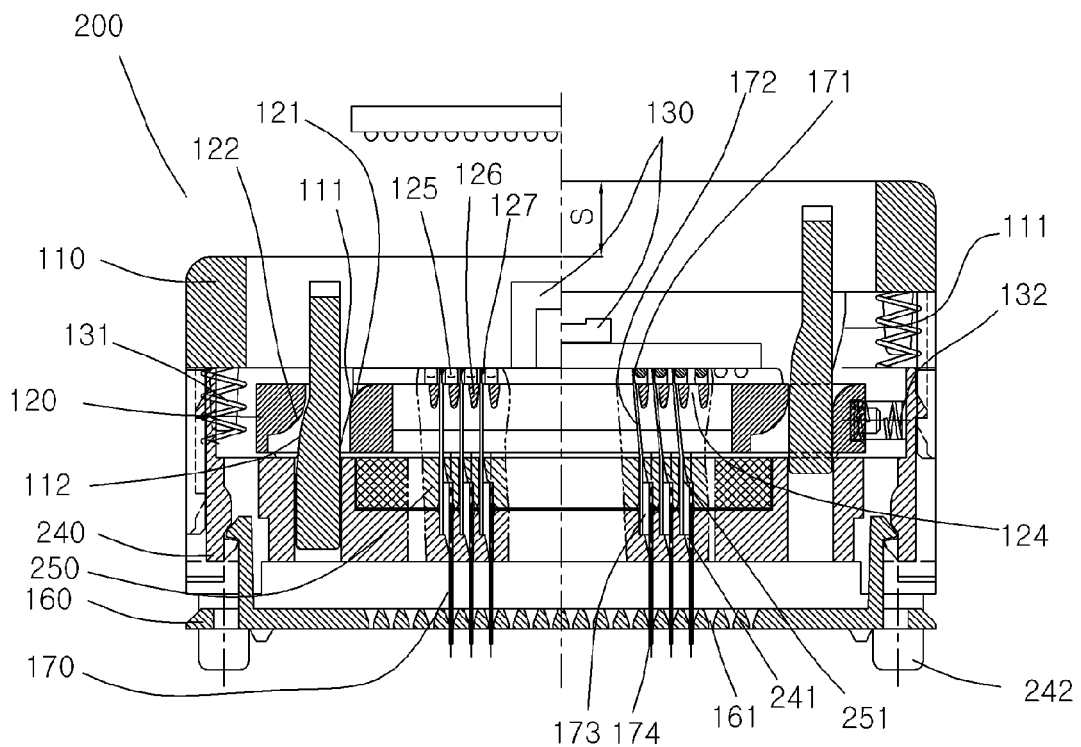

[Fig. 31]
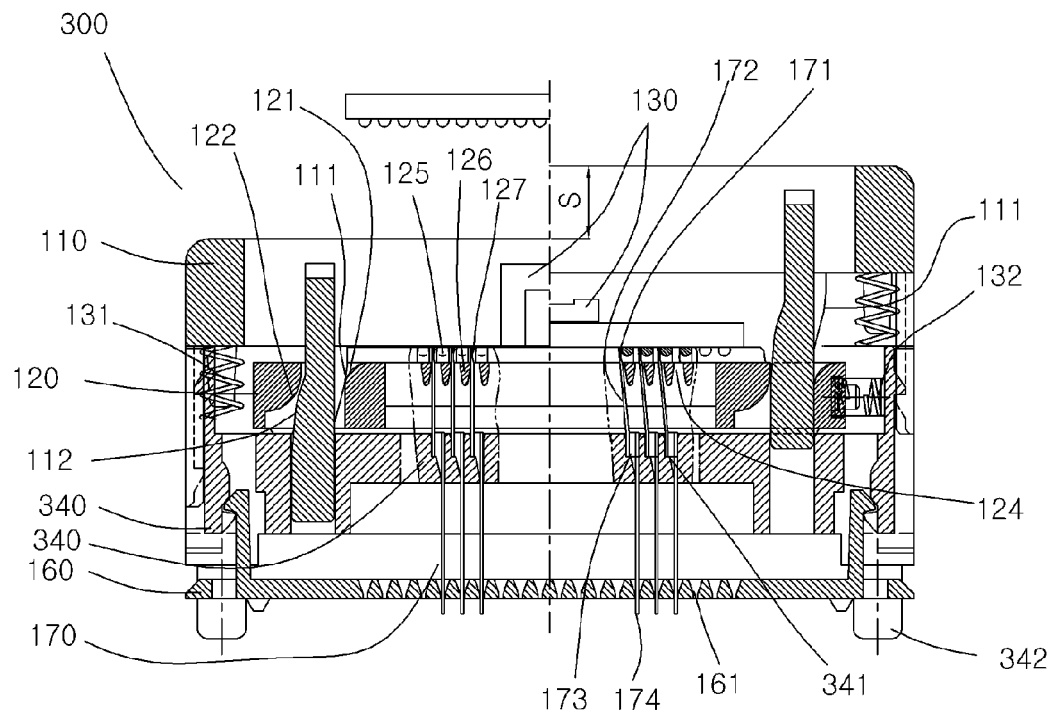
[Fig. 32]
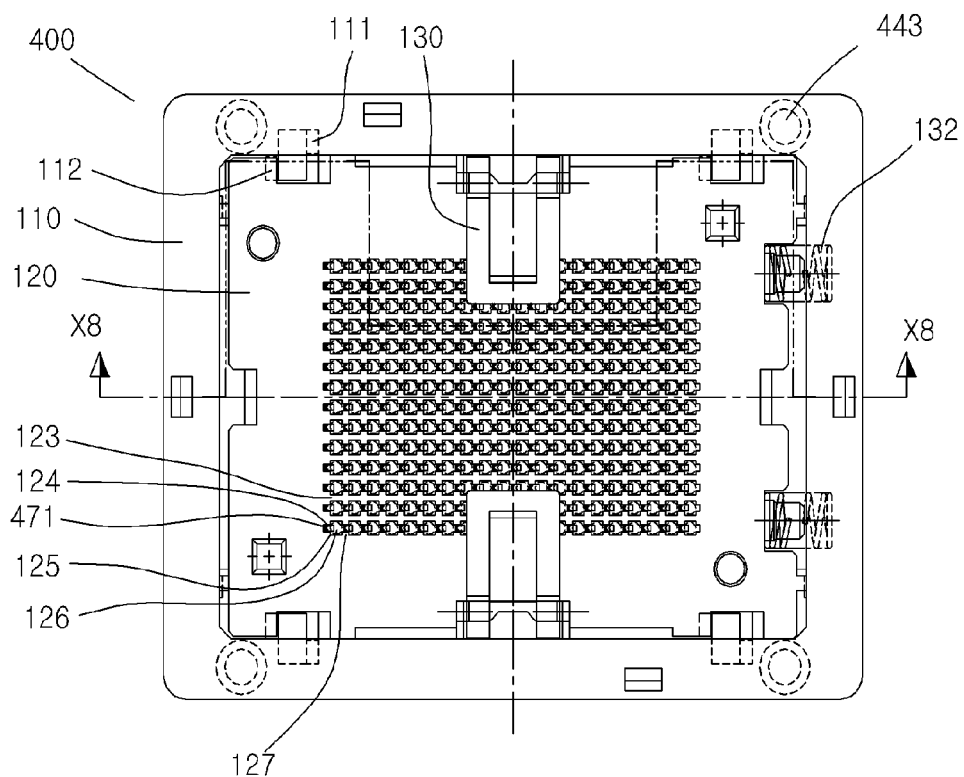

[Fig. 33]
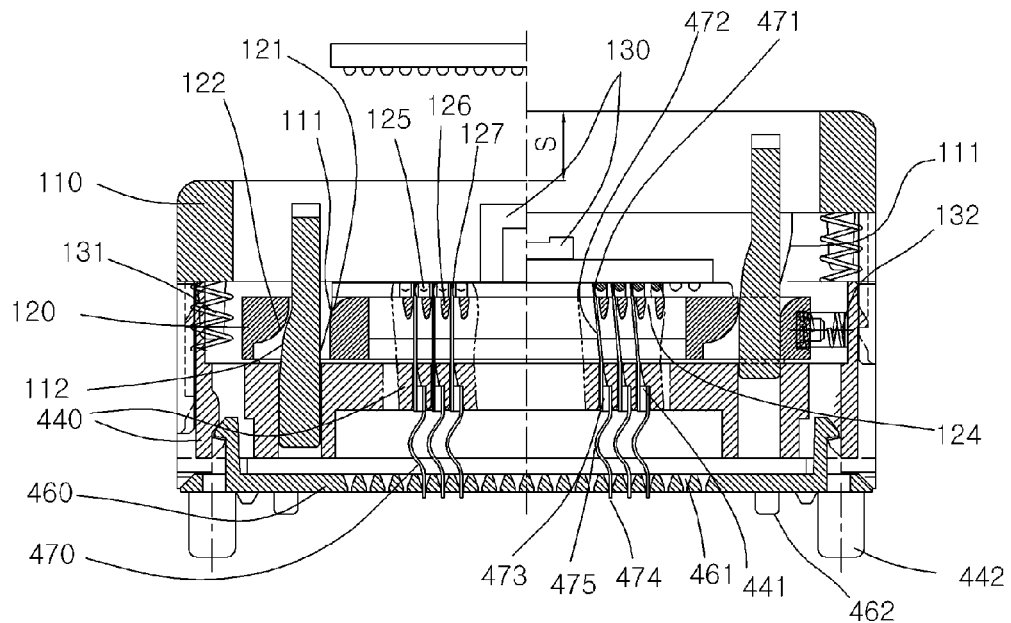
[Fig. 34]
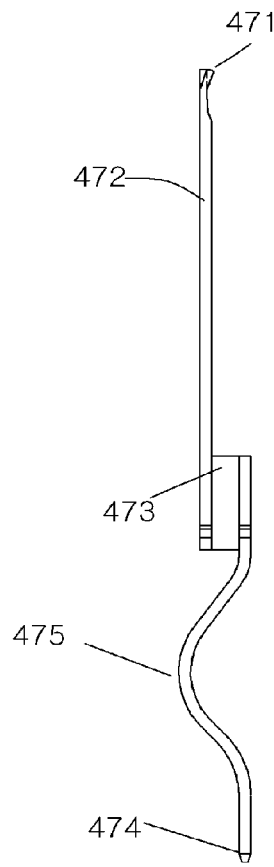

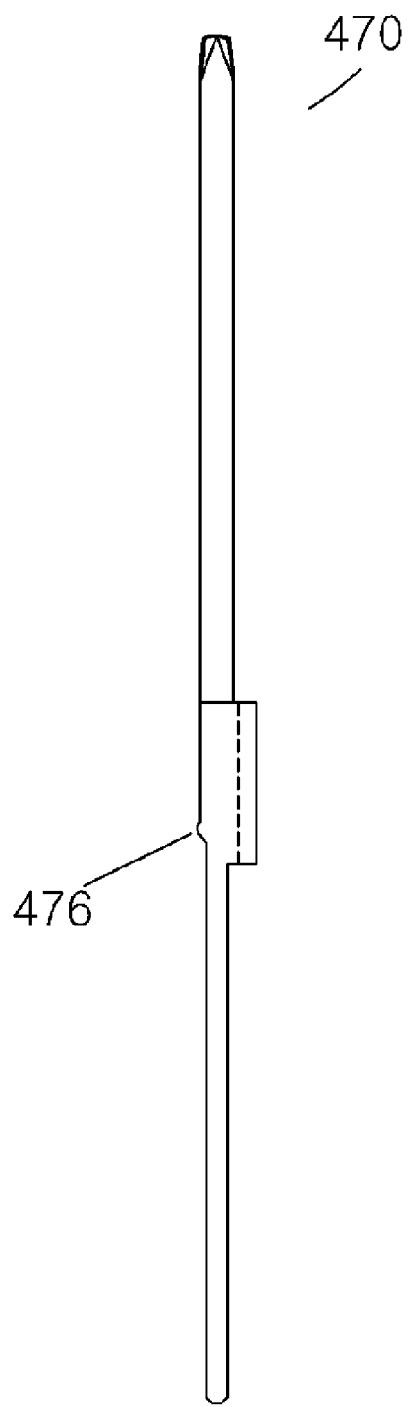
[Fig. 35]

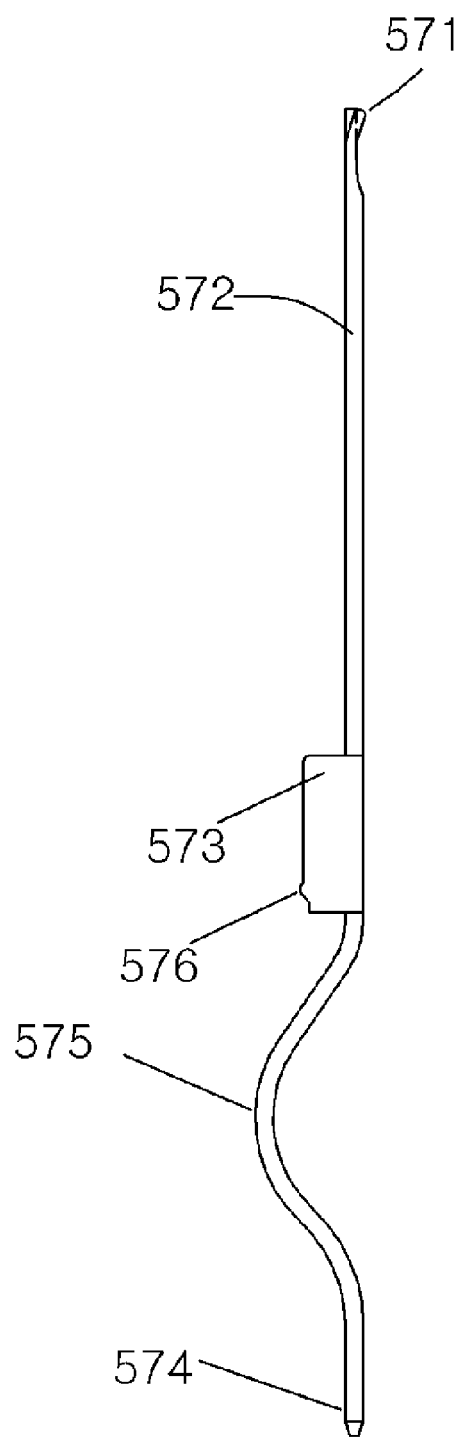
[Fig. 36]

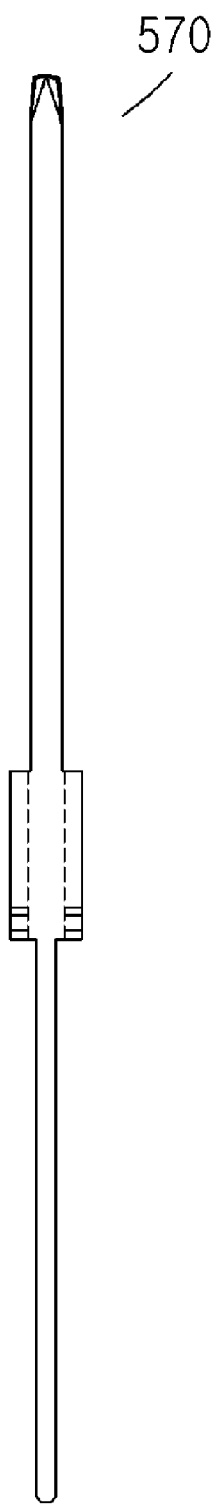
[Fig. 37]

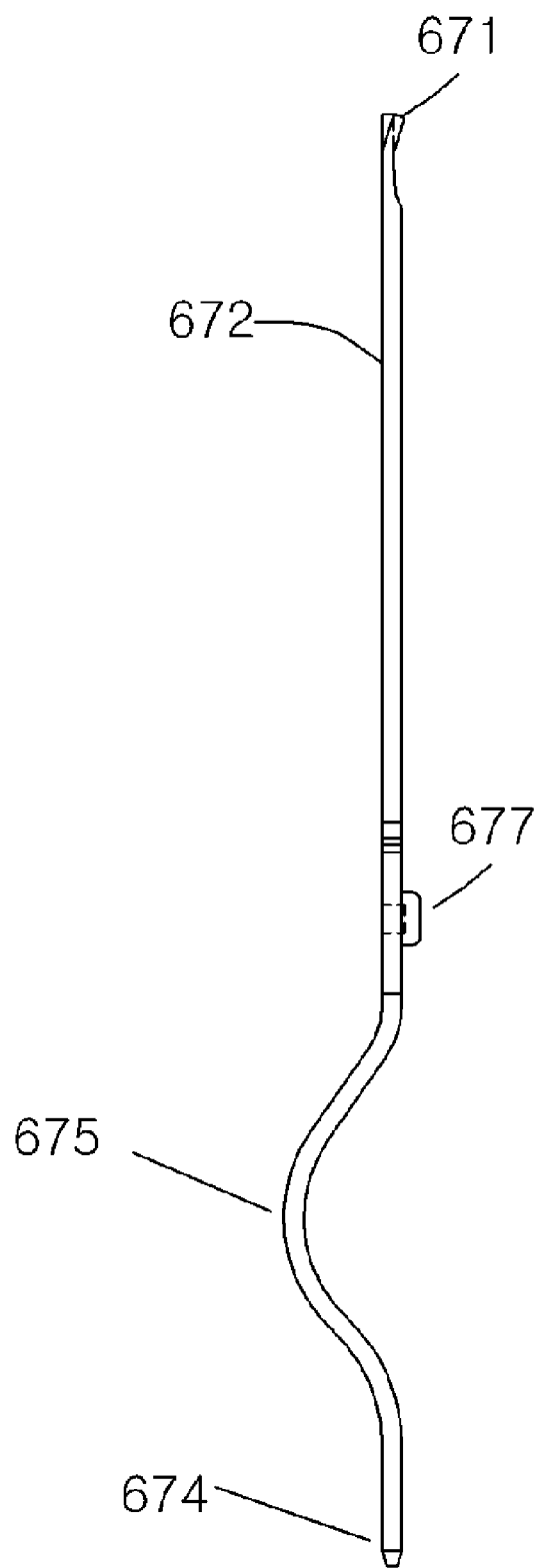
[Fig. 38]

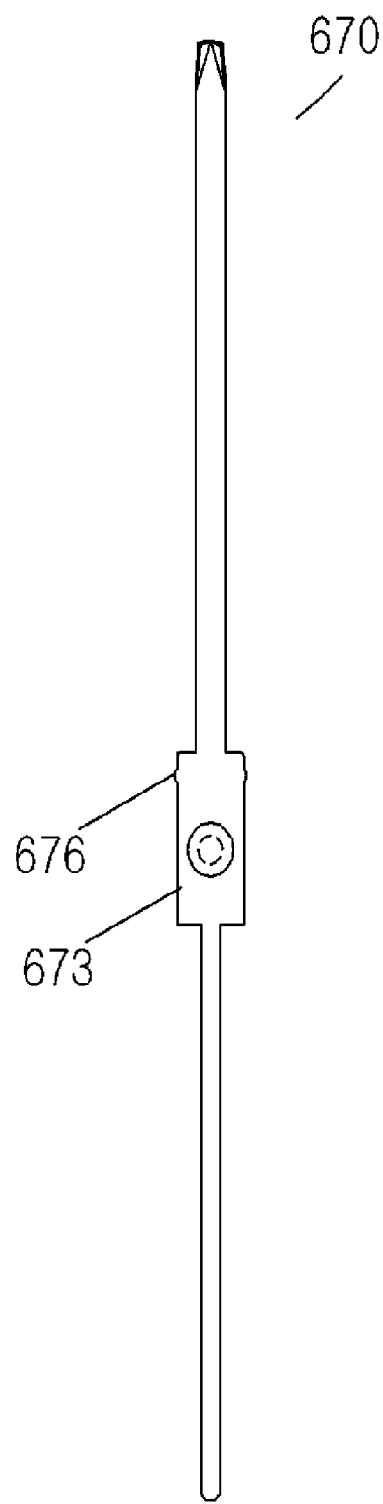
[Fig. 39]

[Fig. 40]
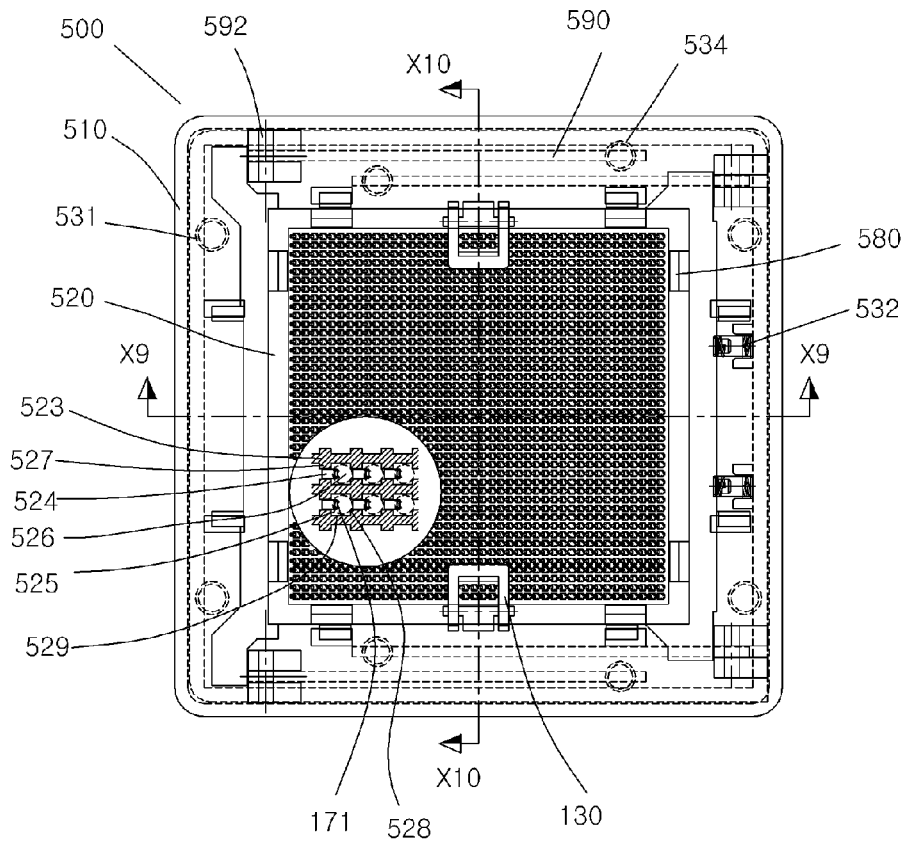
[Fig. 41]
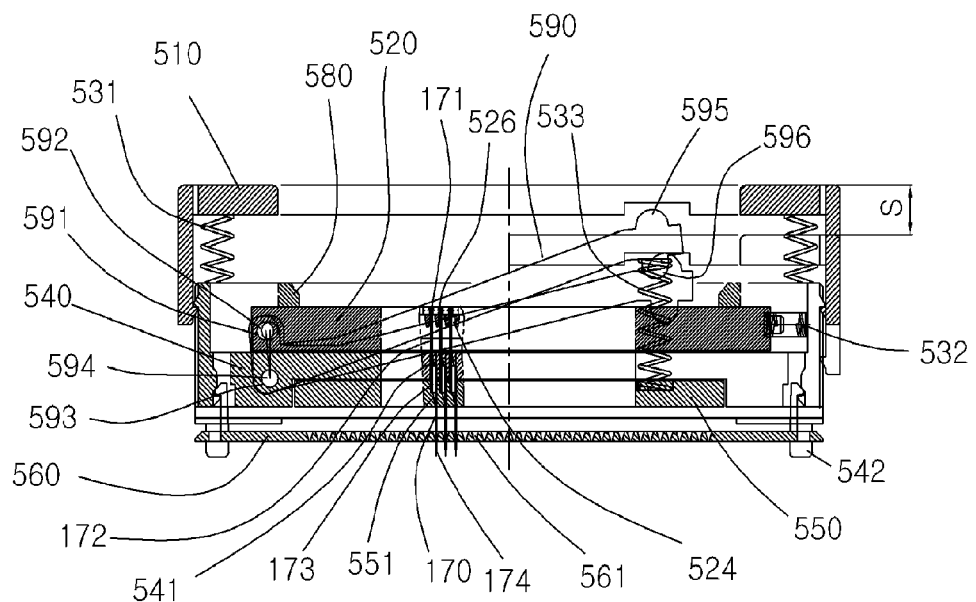

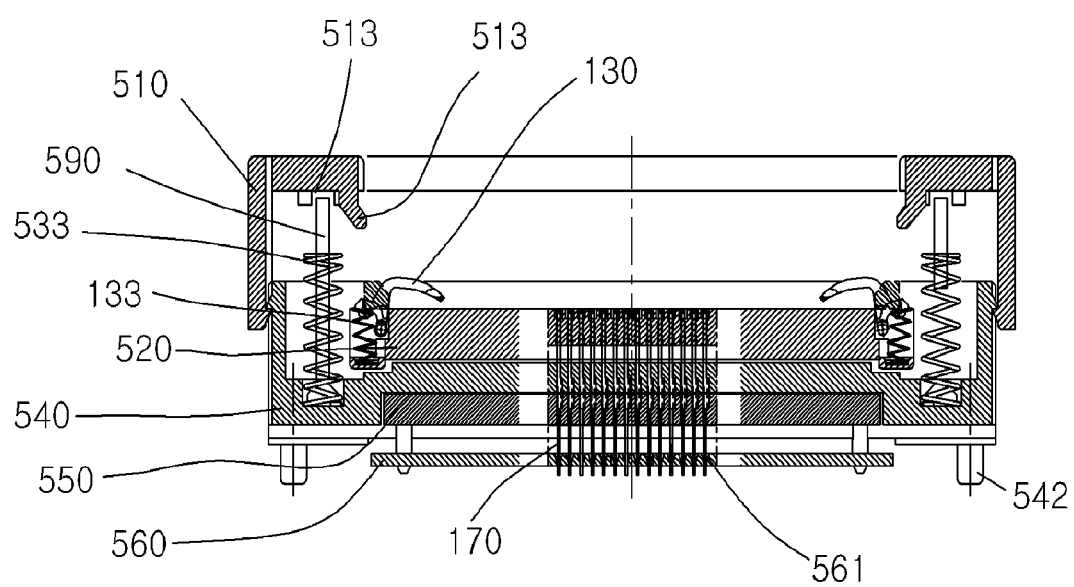
[Fig. 42]

BGA-TYPE TEST AND BURN-IN SOCKET FOR INTEGRATED CIRCUITS (ICS)

TECHNICAL FIELD

The present invention relates to a BGA-type test and burn-in socket for integrated circuits and, more particularly, to a BGA-type test and burn-in socket for integrated circuits, which can have 900 (30×30) or more contacts at a pitch of 0.65 mm or less, dramatically increases the life span of the socket, and dramatically reduces production costs, including the material and assembly costs, in comparison with a conventional socket.

BACKGROUND ART

Generally, a socket for integrated circuits (hereinafter, referred to as an "IC") is loaded into a test board or a burn-in board. The socket is connected to measuring devices for measuring the properties of a burn-in chamber, peripheral devices and an IC, thus being used in a system for testing the IC. In this case, the burn-in chamber is used to input and output power and electric signals, which are required to drive the IC, through I/O terminals (input and output terminals) formed on the board.

Among the ICs that have been widely used, a BGA (Ball Grid Array) type of IC is shaped as shown in FIGS. 1 and 2.

The BGA-type IC is defined as an IC which uniformly arranges conductive terminals, that is, balls, throughout the bottom (lower surface) of the IC at regular intervals, thus remarkably reducing the size and thickness of the IC.

Generally, the pitch between the balls formed on the bottom of the BGA-type IC is 0.5 mm, 0.75 mm, 0.8 mm, 1.0 mm, 1.27 mm, 1.6 mm, etc. Each ball has a diameter from 0.3 mm to 0.9 mm.

Further, the height from the lower surface of the BGA-type IC to each ball is set from 0.2 mm to 0.6 mm. As the pitch between the balls is reduced, the diameter and height of the balls are reduced.

Hereinafter, the conventional socket (hereinafter, referred to as a "BGA-type socket") for loading the above-mentioned BGA-type IC will be examined in detail with reference to FIGS. 2 to 5. The problems with the conventional BGA-type socket will be described in detail.

FIG. 3 is a plan view of the conventional BGA-type socket, FIG. 4 is a vertical sectional view taken along line X1-X1 of the conventional BGA-type socket, FIG. 5 is a detailed view of part of FIG. 4, FIG. 6 is a schematic operational view of the conventional BGA-type socket, and FIG. 7 is a view illustrating the incompletely formed state of a slide, which is an important part of the conventional socket.

The conventional representative socket for loading a BGA-type IC is characterized in that it is provided with pinch-type contacts.

As shown in FIGS. 5 to 7, the conventional BGA-type socket includes contacts 16, a socket body 17, a stopper 18, a lead guide 19, a slide, holder springs 13, and a cover 11. Each of the contacts 16 includes two terminals, that is, a fixed terminal 20 and a movable terminal 21, which contact a corresponding ball of the BGA-type IC. Each contact also includes a contact body and a lead which may be soldered to a PCB. The socket body 17 accommodates the contact body. The stopper 18 and the lead guide 19 which guide the lead are provided under the socket body, and the slide 15 and the cover 11 are provided above the socket body. The stopper 18 supports each contact 16 assembled with the socket body 17. The lead guide 19 functions to guide the position of the lead of each contact 16. The slide includes slide elements 22. When the cover is pressed down by slide cams of the cover 11, the slide moves rightwards, so that each slide element 22 pushes the movable terminal 21 of the corresponding contact 16. Thereby, the movable terminal 21 is spaced further apart from the fixed terminal 20 of each contact, in comparison with the initial distance. The slide rotatably holds IC holders 14, with an IC guide 12 being assembled with the slide. The IC holders 14 are rotatably assembled with the slide to hold the IC. The holder springs 13 elastically support a plurality of IC holders 14. The IC guide 12 functions to guide the position of the IC, when the IC is loaded into the socket. Further, the cover 11 is elastically supported by springs 9 and is constructed to move downwards a predetermined distance. When the cover 11 moves downwards, the slide is moved rightwards by the slide cams, thus opening the contacts.

As shown in FIG. 5, the fixed terminal 20 and the movable terminal 21 of each contact 16 are respectively located to the left and right of the corresponding slide element 22. The fixed terminal 20 and the movable terminal 21 of neighboring contacts are respectively located to the left and right of neighboring slide elements.

That is, the conventional BGA-type socket having the pinch-type contacts constructed as described above is characterized in that one fixed terminal and one movable terminal are provided between neighboring slide elements 22.

The schematic operation of the conventional BGA-type socket having the pinch-type contacts constructed as described above will be described below.

As shown in FIG. 6, the first step represents an initial state. In this case, the cover 11 is located at an upper position by a predetermined elastic force of the cover springs that elastically support the cover 11, and the fixed terminal 20 and the movable terminal 21 of each contact are in close contact with both sides of the corresponding slide element 22.

At the second step, the cover 11 is pressed down by an operating distance S, so that the slide is moved rightwards by the cams provided on the cover. At this time, the right surface of the slide element 22 pushes the movable terminal 21 rightwards, thus opening the corresponding contact.

That is, the fixed terminal 20 is spaced apart from the movable terminal 21 by a predetermined width.

In such a state, the IC is positioned inside the IC guide. Thus, each ball of the IC is located between the fixed terminal and the movable terminal of the corresponding contact.

Finally, at the third step, the cover 11 returns to its original position. At this time, as the slide returns to its original position, each movable terminal 21 also returns to its original position. Thereby, each IC ball contacts the movable terminal 21 and the fixed terminal 20.

The conventional BGA-type socket constructed as described above has the following problems.

First, since the fixed terminal and the movable terminal of the contacts simultaneously enter between neighboring slide elements 22, the two terminals (fixed terminal and movable terminal) require a predetermined moving space. Thus, the space for each slide element 22 is somewhat reduced.

This causes a problem when the slide is manufactured through an injection molding process. That is, as shown in FIG. 7, an incompletely formed state occurs in the central portion of a slide part 30.

In a detailed description, the space for each slide element is relatively smaller than the moving space for two terminals (fixed terminal and movable terminal) of each contact, so that the flow of injected resin for the injection molding process is poor.

Especially when the socket has a very narrow pitch of 0.65 mm or less and the number of balls in a ball grid is 20×20 or more, the above-mentioned problems, such as the incompletely formed state, occur frequently.

Meanwhile, when the number of balls is 30×30 or more, a satisfactory forming process is not realized using current injection forming technology.

Second, the cover of the socket is pressed down, so that the slide is moved rightwards by the cams of the cover, and the movable terminal of each contact is pushed by the corresponding slide element. In this case, the force pushing one movable terminal is usually about 50 (gf). Assuming that the total number of contacts loaded into the socket is 400 (20×20), the slide is pushed with a calculated force of 20 (kgf).

Therefore, by pressing down the cover, a force of 20 (kgf) is applied to the cams of the cover. In proportion to the force, a force of pressing the cover is considerably increased, so that it is difficult for a user to operate the socket.

Supposing that the total number of contacts on the socket is 900 (30×30), a force of 45 (kgf) is required to move the slide. It is difficult to realize such a socket using current socket manufacturing technology and injection molding technology.

Third, the pinch-type contact is provided with two terminals (fixed terminal and movable terminal), so that a lot of material is required to form the contact. Thereby, manufacturing costs are increased.

Fourth, in order to load the IC on the pinch-type contacts, each movable terminal is pushed a predetermined distance by the slide element, so that the movable terminal is elastically deformed. Thereby, the contact is opened. Such a construction is problematic in that the life span of the socket is reduced due to the stress acting on the movable terminal.

Fifth, a different IC guide must be developed according to the size of an IC loaded into the socket. Thus, a different mold for the IC guide must be manufactured, which is inefficient and increases the cost of a product.

DISCLOSURE OF INVENTION

Technical Problem

Accordingly, the present invention has been made keeping in mind the above problems occurring in the prior art, and an object of the present invention is to provide a BGA-type test and burn-in socket for ICs, in which a contact on the socket comprises a single terminal, thus remarkably reducing the amount of a material required for the contact, and allowing the contact to be more easily assembled, therefore reducing manufacturing costs thereof.

Another object of the present invention is to provide a BGA-type test and burn-in socket for ICs, which allows important parts of the socket, including a slide and a socket body, to be very efficiently manufactured through an injection molding process, and allows the parts to be formed using current injection or mold technology even when the socket has a narrow pitch of 0.65 mm or less and the number of balls in a ball grid is 30×30 or more.

A further object of the present invention is to provide a BGA-type test and burn-in socket for ICs, which is constructed such that a slide is moved by cams of a cover when the cover is pressed, and a slide element is moved away from a single contact, unlike the prior art, where the contact is pushed by the slide element, thus minimizing the force required to move the slide, and minimizing the force to operate the cover, therefore allowing the socket to be operated with a low operating force even when the number of contacts is 900 (30×30) or more.

Yet another object of the present invention is to provide a BGA-type test and burn-in socket for ICs, which is constructed so that it is not necessary to directly apply a stress to a contact through a slide element, thus considerably increasing the life span of the socket.

A still further object of the present invention is to provide a BGA-type test and burn-in socket for ICs, in which a function of guiding IC balls is incorporated into a slide, thus allowing an IC to be loaded into the socket without an IC guide, in consideration of the accuracy characteristics of an automatic IC loading machine (auto loader, auto sorter), which is currently widely used.

Technical Solution

In order to accomplish the objects, the present invention provides a BGA-type test and burn-in socket for integrated circuits (ICs), including a plurality of contacts, each of the contacts having an upper contact terminal having a straight-line shape and contacting a ball of an IC, an elastic part that is elastically deformed, a contact body, and a contact lead soldered into a through hole of a printed circuit board (PCB); a socket body (140), including a plurality of contact holes (141) to receive and support the contacts, a plurality of positioning pins (142) provided on a lower portion of the socket body to secure the socket body to a predetermined position on the PCB, a stopper (150) provided on the lower portion of the socket body to receive and support the contact body, a lead guide (160) downwardly movably provided on the lower portion of the socket body, protecting the contact lead, and guiding a position of the contact lead, and a slide (120) and a cover (110) provided on an upper portion of the socket body; the cover (110) elastically biased to the socket body (140) via a plurality of cover springs (131) and moving downwards by a predetermined distance (S), the cover including a plurality of open cams (111) and closure cams (112) to move the slide (120) horizontally, and a plurality of holder rotating pins (113) to rotate IC holders (130); the slide (120) elastically biased to the socket body (110) via a plurality of slide springs (132) such that the slide smoothly restores an original position thereof, and elastically supported via holder springs (133) to rotate the IC holders (130) upwards and downwards, the slide including a plurality of open cam contact parts (121) contacting the open cams (111) of the cover (110), when the cover (110) is pressed down, a plurality of closure cam contact parts (122) contacting the closure cams (112) of the cover (110), when the cover (110) moves upwards to restore an original position thereof, a plurality of contact through holes (124) through which the contacts movably pass, and a plurality of rectangular ball guides (129) to receive associated balls of the IC; and a plurality of IC holders (130) to move downwards, thus pressing an upper portion of the IC, when the cover (110) is pressed downwards to push the holder rotating pins (113) of the cover (110), whereby, when the cover (110) moves downwards by a predetermined distance (S), the slide (120) is moved rightwards by the open cams (111) of the cover (110) and the IC holders (130) are opened, so that the upper contact terminal of each of the contacts is in close contact with a left side in an associated contact through hole (124), and, after the IC is seated on an upper surface of the slide (120), the cover (110) restores the original position thereof, so that the closure cams (112) move the slide (120) leftwards and the IC holders (130) press the IC downwards, and thereafter, the IC ball received in a ball insert hole (125) of each of the ball guides (129) moves to the left together with the slide (120), and, when the cover (110) has completely restored the original position thereof, the IC ball comes into contact with the upper contact terminal of each of the contacts while being received in the ball guide (129).

Preferably, the slide (120) further includes a plurality of IC guides to allow the ball of the IC loaded into the slide to be easily inserted into each of the contact through holes (124).

Further, each of the contacts comprises a contact including an elastic part having predetermined elasticity and an upper contact terminal that extend upwards from a left side of a contact body provided on a central portion of the contact, a contact lead extending downwards from a right side of the contact body and coming into contact with the PCB, and a force fitting protrusion provided on a predetermined portion of the contact body; a contact bent in a Z shape, including an elastic part having predetermined elasticity and an upper contact terminal that extend upwards from a U-shaped contact body provided on a central portion of the contact, a contact lead extending downwards from the contact body and coming into contact with the PCB, and a force fitting protrusion provided on a predetermined portion of the contact body; or a straight line-shaped contact having no bent parts, including an elastic part having predetermined elasticity and an upper contact terminal that extend upwards from a contact body provided on a central portion of the contact, a contact lead extending downwards from the contact body and coming into contact with the PCB, and a force fitting protrusion and a thickness compensation protrusion that are provided on predetermined portions of the contact body.

The present invention provides a BGA-type test and burn-in socket for integrated circuits (ICs), including a plurality of contacts, each of the contacts having an upper contact terminal having a straight-line shape and contacting a ball of an IC, an elastic part that is elastically deformed, a contact body, and a contact lead soldered into a through hole of a printed circuit board (PCB); a socket body (140), including a plurality of contact holes (241) to receive and support the contacts, a plurality of positioning pins (242) provided on a lower portion of the socket body to secure the socket body to a predetermined position on the PCB, a lead guide (160) downwardly movably provided on the lower portion of the socket body, protecting the contact lead, and guiding a position of the contact lead, and a stopper (250), a slide (120), and a cover (110) that are provided on an upper portion of the socket body, the stopper receiving and supporting the contact body; the cover (110) elastically biased to the socket body (140) via a plurality of cover springs (131) and moving downwards by a predetermined distance (S), the cover including a plurality of open cams (111) and closure cams (112) to move the slide (120) horizontally, and a plurality of holder rotating pins (113) to rotate IC holders (130); the slide (120) elastically biased to the socket body (110) via a plurality of slide springs (132) such that the slide smoothly restores an original position thereof, and elastically supported via holder springs (133) to rotate the IC holders (130) upwards and downwards, the slide having a plurality of open cam contact parts (121) contacting the open cams (111) of the cover (110), when the cover (110) is pressed down, a plurality of closure cam contact parts (122) contacting the closure cams (112) of the cover (110), when the cover (110) moves upwards to restore an original position thereof, a plurality of contact through holes (124) through which the contacts movably pass, and a plurality of rectangular ball guides (129) to receive associated balls of the IC; and a plurality of IC holders (130) to move downwards, thus pressing an upper portion of the IC, when the cover (110) is pressed downwards to push the holder rotating pins (113) of the cover (110), whereby, when the cover (110) moves downwards by a predetermined distance (S), the slide (120) is moved rightwards by the open cams (111) of the cover (110) and the IC holders (130) are opened, so that the upper contact terminal of each of the contacts is in close contact with a left side in an associated contact through hole (124), and, after the IC is seated on an upper surface of the slide (120), the cover (110) restores the original position thereof, so that the closure cams (112) move the slide (120) leftwards and the IC holders (130) press the IC downwards, and thereafter, the IC ball received in a ball insert hole (125) of each of the ball guides (129) is moved to the left together with the slide (120), and, when the cover (110) has completely restored the original position thereof, the IC ball comes into contact with the upper contact terminal of each of the contacts while being received in the ball guide (129).

Preferably, the slide (120) further includes a plurality of IC guides to allow the ball of the IC loaded into the slide to be easily inserted into each of the contact through holes (124).

Further, each of the contacts comprises a contact including an elastic part having predetermined elasticity and an upper contact terminal that extend upwards from a left side of a contact body provided on a central portion of the contact, a contact lead extending downwards from a right side of the contact body and coming into contact with the PCB, and a force fitting protrusion provided on a predetermined portion of the contact body; a contact bent in a Z shape, including an elastic part having predetermined elasticity and an upper contact terminal that extend upwards from a U-shaped contact body provided on a central portion of the contact, a contact lead extending downwards from the contact body and coming into contact with the PCB, and a force fitting protrusion provided on a predetermined portion of the contact body; or a straight line-shaped contact having no bent parts, including an elastic part having predetermined elasticity and an upper contact terminal that extend upwards from a contact body provided on a central portion of the contact, a contact lead extending downwards from the contact body and coming into contact with the PCB, and a force fitting protrusion and a thickness compensation protrusion that are provided on predetermined portions of the contact body.

The present invention provides a BGA-type test and burn-in socket for integrated circuits (ICs), including a plurality of contacts, each of the contacts having an upper contact terminal having a straight-line shape and contacting a ball of an IC, an elastic part that is elastically deformed, a contact body, and a contact lead soldered into a through hole of a printed circuit board (PCB); a socket body (340) including a plurality of contact holes (341) to receive and support the contacts, a plurality of positioning pins (342) provided on a lower portion of the socket body to secure the socket body to a predetermined position on the PCB, a lead guide (160) downwardly movably provided on the lower portion of the socket body, protecting the contact lead, and guiding a position of the contact lead, and a slide (120) and a cover (110) that are provided on an upper portion of the socket body; the cover (110) elastically biased to the socket body (140) via a plurality of cover springs (131) and moving downwards by a predetermined distance (S), the cover including a plurality of open cams (111) and closure cams (112) to move the slide (120) horizontally, and a plurality of holder rotating pins (113) to rotate IC holders (130); the slide (120) elastically biased to the socket body (110) via a plurality of slide springs (132) such that the slide smoothly restores an original position thereof, and elastically supported via holder springs (133) to rotate the IC holders (130) upwards and downwards, the slide including a plurality of open cam contact parts (121) contacting the open cams (111) of the cover (110), when the cover (110) is pressed down, a plurality of closure cam contact parts (122) contacting the closure cams (112) of the cover (110), when the cover (110) moves upwards to restore an original position thereof, a plurality of contact through holes (124) through which the contacts movably pass, and a plurality of rectangular ball guides (129) to receive associated balls of the IC; and a plurality of IC holders (130) to move downwards, thus pressing an upper portion of the IC, when the cover (110) is pressed downwards to push the holder rotating pins (113) of the cover (110), whereby, when the cover (110) moves downwards by a predetermined distance (S), the slide (120) is moved rightwards by the open cams (111) of the cover (110) and the IC holders (130) are opened, so that the upper contact terminal of each of the contacts is in close contact with a left side in an associated contact through hole (124), and, after the IC is seated on an upper surface of the slide (120), the cover (110) restores the original position thereof, so that the closure cams (112) move the slide (120) leftwards and the IC holders (130) press the IC downwards, and thereafter, the IC ball received in a ball insert hole (125) of each of the ball guides (129) moves to the left together with the slide (120), and, when the cover (110) has completely restored the original position thereof, the IC ball comes into contact with the upper contact terminal of each of the contacts while being received in the ball guide (129).

Preferably, the slide (120) further includes a plurality of IC guides to allow the ball of the IC loaded on the slide to be easily inserted into each of the contact through holes (124).

Further, each of the contacts comprises a contact, including an elastic part having predetermined elasticity and an upper contact terminal that extend upwards from a left side of a contact body provided on a central portion of the contact, a contact lead extending downwards from a right side of the contact body and coming into contact with the PCB, and a force fitting protrusion provided on a predetermined portion of the contact body; a contact bent in a Z shape, including an elastic part having predetermined elasticity and an upper contact terminal that extend upwards from a U-shaped contact body provided on a central portion of the contact, a contact lead extending downwards from the contact body and coming into contact with the PCB, and a force fitting protrusion provided on a predetermined portion of the contact body; or a straight line-shaped contact having no bent parts, including an elastic part having predetermined elasticity and an upper contact terminal that extend upwards from a contact body provided on a central portion of the contact, a contact lead extending downwards from the contact body and coming into contact with the PCB, and a force fitting protrusion and a thickness compensation protrusion that are provided on predetermined portions of the contact body.

The present invention provides a BGA-type test and burn-in socket for integrated circuits (ICs), including a plurality of contacts, each of the contacts including an upper contact terminal having a straight-line shape and contacting a ball of an IC, an elastic part that is elastically deformed, a contact body, a lead elastic part, and a contact lead elastically contacting a contact pad of a PCB due to elastic deformation of the lead elastic part; a socket body (440), including a plurality of contact holes (441) to receive and support the contacts, a plurality of positioning pins (442) provided on a lower portion of the socket body to secure the socket body to a predetermined position on the PCB, a plurality of screw holes (443) used to fasten the socket to the PCB via screws, a plurality of guide pins (462) provided on the lower portion of the socket body to protect the contact leads and guide positions of the contact leads, and locating the contact leads at predetermined positions, when the socket is mounted on the PCB, a lead guide (460) downwardly movably provided on the lower portion of the socket body, and a slide (120) and a cover (110) provided on an upper portion of the socket body; the cover (110) elastically biased to the socket body (440) via a plurality of cover springs (131) and moving downwards by a predetermined distance (S), the cover including a plurality of open cams (111) and closure cams (112) to move the slide (120) horizontally, and a plurality of holder rotating pins (113) to rotate IC holders (130); the slide (120) elastically biased to the socket body (10) via a plurality of slide springs (132) such that the slide smoothly restores an original position thereof, and elastically supported via holder springs (133) to rotate the IC holders (130) upwards and downwards, the slide including a plurality of open cam contact parts (121) contacting the open cams (111) and the closure cams (112) of the cover (110), when the cover (110) is pressed down, a plurality of closure cam contact parts (122) contacting the closure cams (112) of the cover (110), when the cover (110) moves upwards to restore an original position thereof, a plurality of contact through holes (124) through which the contacts movably pass, and a plurality of rectangular ball guides (129) to receive an associated ball of the IC; and a plurality of IC holders (130) to move downwards, thus pressing an upper portion of the IC, when the cover (110) is pressed downwards to push the holder rotating pins (113) of the cover (110), whereby, when the cover (110) moves downwards by a predetermined distance (S), the slide (120) is moved rightwards by the open cams (111) of the cover (110) and the IC holders (130) are opened, so that the upper contact terminal of each of the contacts is in close contact with a left side in an associated contact through hole (124), and, after the IC is seated on an upper surface of the slide (120), the cover (110) restores the original position thereof, so that the closure cams (112) move the slide (120) leftwards and the IC holders (130) press the IC downwards, and thereafter, the IC ball received in a ball insert hole (125) of each of the ball guides (129) moves to the left together with the slide (120), and, when the cover (110) has completely restored the original position thereof, the IC ball comes into contact with the upper contact terminal of each of the contacts while being received in the ball guide (129).

Preferably, the slide (120) further includes a plurality of IC guides to allow the ball of the IC loaded on the slide to be easily inserted into each of the contact through holes (124).

Further, each of the contacts comprises a contact, including an elastic part having predetermined elasticity and an upper contact terminal that extend upwards from a left side of a contact body provided on a central portion of the contact, a lead elastic part and a contact lead that extend downwards from a right side of the contact body, the lead elastic part having an arc-shaped bent part, and the contact lead coming into contact with the PCB, and a force fitting protrusion provided on a predetermined portion of the contact body; a contact, including an elastic part having predetermined elasticity and an upper contact terminal that extend upwards from a U-shaped contact body provided on a central portion of the contact, a lead elastic part and a contact lead that extend downwards from the contact body, the lead elastic part having an arc-shaped bent part, and the contact lead coming into contact with the PCB, and a force fitting protrusion provided on a predetermined portion of the contact body; or a contact, including an elastic part having predetermined elasticity and an upper contact terminal that extend upwards from a contact body provided on a central portion of the contact, a lead elastic part and a contact lead that extend downwards from the contact body, the lead elastic part having an arc-shaped bent part, and the contact lead coming into contact with the PCB, and a force fitting protrusion and a screw-head-shaped thickness compensation protrusion that are provided on predetermined portions of the contact body.

The present invention provides a BGA-type test and burn-in socket for integrated circuits (ICs), including a plurality of contacts, each of the contacts having an upper contact terminal having a straight-line shape and contacting a ball of an IC, an elastic part that is elastically deformed, a contact body, and a contact lead soldered into a through hole of a printed circuit board (PCB); a socket body (540), including a plurality of contact holes (541) to receive and support the contacts, a plurality of positioning pins (542) provided on a lower portion of the socket body to secure the socket body to a predetermined position on the PCB, a plurality of rotary holes (593) and rotary shafts (594) used to rotatably mount a plurality of levers (590) to the socket body, a stopper (550) provided on the lower portion of the socket body to receive and support the contact body, a lead guide (560) downwardly movably provided on the lower portion of the socket body, protecting the contact lead, and guiding a position of the contact lead, and a slide (520) and a cover (510) provided on an upper portion of the socket body; a plurality of levers (590) functioning to move the slide (520) horizontally, a first side of each of the levers being rotatably mounted to the socket body via the rotary holes (593) and rotary shafts (594), with an upper portion of the first side being mounted to the slide via a moving hole (591) and a moving shaft (592), each of the levers including a lever spring (533) elastically supported between a lower portion of a second side of each of the levers and the socket body (540), a semicircular spring guide protrusion (596) provided on the lower portion of the second side of each of the levers to hold the lever spring (533), and a semicircular push part (595) provided on an upper portion of the second side of each of the levers; the cover (110) elastically biased to the socket body (540) via a plurality of cover springs (531), and moving downwards by a predetermined distance (S) to press the push part (595) of the lever (590) downwards, thus operating the lever (590), the cover including a plurality of holder rotating pins (113) to rotate IC holders (130); the slide (520) elastically supported via holder springs (133) to rotate the IC holders (130) upwards and downwards, and elastically biased to the socket body (540) via a plurality of slide springs (532) such that the slide smoothly restores an original position thereof, and assembled with each of the levers (590) via the moving hole (591) and the moving shaft (592) to be moved horizontally, the slide including a plurality of contact through holes (524) through which the contacts movably pass, and a plurality of rectangular ball guides (129) to receive an associated ball of the IC; and a plurality of IC holders (130) to move downwards, thus pressing an upper portion of the IC, when the cover (510) is pressed downwards to push the holder rotating pins (513) of the cover (510), whereby, when the cover (510) moves downwards by a predetermined distance (S), the push part (595) of each lever (590) is pressed down, the holder rotating pin (513) moves downwards, the IC holder (130) is opened, and the slide (520) mounted to the socket body via the moving hole (591) and the moving shaft (592) moves rightwards, so that the upper contact terminals of the contacts are in close contact with left sides of the contact through holes (524), and, after the IC is seated on an upper surface of the slide (520), the cover (510) restores the original position thereof, so that the lever (590) returns to an original position thereof by a restoring force of the lever spring (533), and the IC ball received in a ball insert hole (125) of each of the ball guides (129) moves leftwards together with the slide (520), and, when the cover (510) has completely restored an original position thereof, the IC ball comes into contact with the upper contact terminal of each of the contacts while being received in the ball guide (129).

Preferably, the slide (520) further includes a plurality of IC guides to allow the ball of the IC loaded on the slide to be easily inserted into each of the contact through holes (524).

Further, each of the contacts comprises a contact, including an elastic part having predetermined elasticity and an upper contact terminal that extend upwards from a left side of a contact body provided on a central portion of the contact, a contact lead extending downwards from a right side of the contact body and coming into contact with the PCB, and a force fitting protrusion provided on a predetermined portion of the contact body; a contact bent in a Z shape, including an elastic part having predetermined elasticity and an upper contact terminal that extend upwards from a U-shaped contact body provided on a central portion of the contact, a contact lead extending downwards from the contact body and coming into contact with the PCB, and a force fitting protrusion provided on a predetermined portion of the contact body; or a straight line-shaped contact having no bent parts, including an elastic part having predetermined elasticity and an upper contact terminal that extend upwards from a contact body provided on a central portion of the contact, a contact lead extending downwards from the contact body and coming into contact with the PCB, and a force fitting protrusion and a thickness compensation protrusion that are provided on predetermined portions of the contact body.

BRIEF DESCRIPTION OF THE DRAWINGS

FIG. 1 is a plan view showing a BGA-type IC;

FIG. 2 is a side view showing the BGA-type IC;

FIG. 3 is a plan view showing a conventional BGA-type socket;

FIG. 4 is a vertical sectional view taken along line X1-X1 of the conventional BGA-type socket;

FIG. 5 is a detailed view showing part of FIG. 4;

FIG. 6 is a schematic operational diagram of the conventional BGA-type socket;

FIG. 7 is a view illustrating the incompletely formed injection state of a slide, which is the important part of the conventional socket;

FIG. 8 is a plan view of a BGA-type test and burn-in socket for ICs, according to the first embodiment of the present invention;

FIG. 9 is a vertical sectional view taken along line X2-X2 of FIG. 8;

FIG. 10 is a vertical sectional view taken along line X3-X3 of FIG. 8;

FIG. 11 is a detailed plan view of portion A of FIG. 8, illustrating the initial state of the BGA-type test and burn-in socket for ICs, according to the first embodiment of this invention;

FIG. 12 is a vertical sectional view taken along line X4-X4 of FIG. 11;

FIG. 13 is a detailed plan view of portion A of FIG. 8, illustrating the positional relationship between contacts, ball guides of a slide, and IC balls, when the IC is loaded into the socket;

FIG. 14 is a vertical sectional view taken along line X5-X5 of FIG. 13;

FIG. 15 is a detailed plan view of portion A of FIG. 8, illustrating the positional relationship between the contacts, the ball guides of the slide, and the IC balls, when the IC is loaded into the socket and a cover returns to its original state;

FIG. 16 is a vertical sectional view taken along line X6-X6 of FIG. 15;

FIG. 17 is a detailed view of portion B of FIG. 10, illustrating the positional relationship between the contacts, the ball guides of the slide, horizontal walls, ball guide holes, and the IC balls;

FIG. 18 is a view illustrating positions where the IC balls drop when the IC is loaded into the socket of FIG. 17, the drawing illustrating the possibility of loading the IC when the IC balls drop to the central portions of the corresponding ball guides;

FIG. 19 is a side view of the contact, according to the first embodiment of the present invention;

FIG. 20 is a front view of the contact, according to the first embodiment of the present invention;

FIG. 21 is a side view of another contact which may be used in the first embodiment of the present invention;

FIG. 22 is a front view of another contact which may be used in the first embodiment of the present invention;

FIG. 23 is a side view of a further contact which may be used in the first embodiment of the present invention;

FIG. 24 is a front view of the further contact which may be used in the first embodiment of the present invention;

FIG. 25 is a plan view showing a modification of the first embodiment according to the present invention;

FIG. 26 is a vertical sectional view taken along line X7-X7 of FIG. 25;

FIGS. 27 to 29 are vertical sectional views of the BGA-type test and burn-in socket for ICs, according to the first embodiment of the present invention;

FIG. 30 is a vertical sectional view of a BGA-type test and burn-in socket for ICs, according to the second embodiment of the present invention;

FIG. 31 is a vertical sectional view of a BGA-type test and burn-in socket for ICs, according to the third embodiment of the present invention;

FIG. 32 is a plan view of a BGA-type test and burn-in socket for ICs, according to the fourth embodiment of the present invention;

FIG. 33 is a vertical sectional view taken along line X8-X8 of FIG. 32;

FIG. 34 is a side view of a contact, according to the fourth embodiment of the present invention;

FIG. 35 is a front view of the contact, according to the fourth embodiment of the present invention;

FIG. 36 is a side view of another contact which may be used in the fourth embodiment of the present invention;

FIG. 37 is a front view of another contact which may be used in the fourth embodiment of the present invention;

FIG. 38 is a side view of a further contact which may be used in the fourth embodiment of the present invention;

FIG. 39 is a front view of the further contact which may be used in the fourth embodiment of the present invention;

FIG. 40 is a plan view of a BGA-type test and burn-in socket for ICs, according to the fifth embodiment of the present invention;

FIG. 41 is a vertical sectional view taken along line X9-X9 of FIG. 40; and

FIG. 42 is a vertical sectional view taken along line X10-X10 of FIG. 40.

BEST MODE FOR CARRYING OUT THE INVENTION

Hereinafter, the present invention will be described in detail with reference to the accompanying drawings.

Reference now should be made to the drawings, in which the same reference numerals are used throughout the different drawings to designate the same components.

For clarity of description of the present invention, the detailed description of known functions and constructions will be omitted.

A BGA-type test and burn-in socket for ICs, according to the first embodiment of the present invention, will be described with reference to FIGS. 8 to 18.

FIG. 8 is a plan view of a BGA-type test and burn-in socket for ICs, according to the first embodiment of the present invention, FIG. 9 is a vertical sectional view taken along line X2-X2 of FIG. 8, FIG. 10 is a vertical sectional view taken along line X3-X3 of FIG. 8, FIG. 11 is a detailed plan view of portion A of FIG. 8, illustrating the initial state of the BGA-type test and burn-in socket for ICs, according to the first embodiment of this invention, FIG. 12 is a vertical sectional view taken along line X4-X4 of FIG. 11, FIG. 13 is a detailed plan view of portion A of FIG. 8, illustrating the positional relationship between contacts, ball guides of a slide, and IC balls, when the IC is loaded into the socket, FIG. 14 is a vertical sectional view taken along line X5-X5 of FIG. 13, FIG. 15 is a detailed plan view of portion A of FIG. 8, illustrating the positional relationship between the contacts, the ball guides of the slide, and the IC balls, when the IC is loaded into the socket and a cover returns to its original state, FIG. 16 is a vertical sectional view taken along line X6-X6 of FIG. 15, FIG. 17 is a detailed view of portion B of FIG. 10, illustrating the positional relationship between the contacts, the ball guides of the slide, horizontal walls, ball insert holes, and the IC balls, and FIG. 18 is a view illustrating positions where the IC balls drop when the IC is loaded into the socket of FIG. 17, the drawing illustrating the possibility of loading the IC when the IC balls drop to the central portions of the corresponding ball guides.

As shown in FIGS. 8 to 10, a body 140 of the BGA-type test and burn-in socket for ICs is provided with a plurality of contact holes 141 which receive and support a plurality of contacts 170, and a plurality of positioning pins 142 which secure the socket to a predetermined position on a PCB.

In this case, the socket body 140 serves as a base for mounting a stopper 150 and a lead guide 160 on the lower portion of the socket body, and in addition, serves as a base for mounting a slide 120 and a cover 110 on the upper portion of the socket body.

The lead guide 160 keeps contact leads 174 straight without bending the contact leads 174. When the socket is mounted on the PCB, the lead guide 160 helps precisely insert the contact leads 174 into through holes formed in the PCB. Further, when the socket is inserted into the PCB, the lead guide 160 enters the bottom of the socket body 140.

In the state where the contacts 170 are inserted into the contact holes 141 of the socket body 140, the stopper 150 functions to prevent the contacts 170 from being removed downwardly from the socket body.

Further, the stopper 150 is assembled with the lower surface of the socket body 140 in such a way as to extend upwards. The stopper 150 is provided with a plurality of holes 151 which allow the contact leads 174 to pass therethrough but prevent contact bodies 173 from being removed therefrom.

The slide 120 is installed on the upper portion in the socket body 140, and is constructed to be movable within a predetermined range in a horizontal direction on the vertical sectional view of FIG. 9.

Further, the slide 120 is the component for loading an IC to be tested on the upper surface of the socket. A plurality of contact through holes 124 and a plurality of ball guides 129 are provided on the upper surface of the slide 120 at predetermined intervals. Upper contact terminals 171 of the contacts movably pass through the contact through holes 124. The ball guides 129 guide and receive the balls of the IC. Further, the slide 120 is provided with a plurality of open cam contact parts 121 and a plurality of closure cam contact parts 122 to correspond to open cams 111 and closure cams 112. Thereby, when the open cams 111 and the closure cams 112 of the cover 110 move up and down, the open cam contact parts and the closure cam contact parts contact the open cams 111 and the closure cams 112 to permit a sliding motion.

Further, a plurality of slide springs 132 is elastically supported between the slide 120 and the socket body 140. Thereby, when the open cams 111 and the closure cams 112 of the cover 110 move upwards to return to original positions thereof, the slide springs 132 allow the open cams and the closure cams to smoothly return to their original positions.

In this embodiment, according to the number or pitch of the contact through holes 124 and the ball guides 129 arranged on the upper surface of the slide 120, the number of balls in the ball grid of an IC that may be loaded in the socket is determined.

Further, when the IC is loaded into the socket, the balls of the IC are inserted into ball insert holes 125 which are provided inside the ball guides 129 of the slide 120. Thus, the bottom of the IC is seated on the upper surface of the slide 120.

Meanwhile, a plurality of IC holders 130 is assembled with the slide 120 in such a way as to rotate up and down, and functions to press the upper surface of the IC after the IC has been seated on the slide. Holder springs 133 are elastically supported between the IC holders 130 and the slide 120.

In this case, the IC holders 130 are constructed to be rotated by holder rotating pins 113 provided on the cover 110 when the cover 110 moves up and down.

The operation of the IC holders 130 will be described in detail with reference to FIG. 10.

FIG. 10 shows the closed or open state of the IC holders 130. When the cover 110 is pressed down, the holder rotating pins 113 provided on the cover 110 rotate the IC holders 130, thus opening the IC holders 130.

In such a state, it is possible to load the IC into the socket.

When the IC is loaded into the socket and thereafter the cover 110 returns to its original state, the IC holders 130 are returned to their original states by the elastic restoring force of the holder springs 133. Thus, the IC holders 130 press down the upper surface of the loaded IC.

Meanwhile, the cover 110 is constructed to move up and down relative to the socket body 140 by the maximum moving distance S. Further, the cover 110 is elastically supported to the socket body 140 through a plurality of cover springs 131.

Further, the cover 110 is provided with the holder rotating pins 113. When the cover 110 moves downwards, the slide 120 is connected to the open cams 111, which force the slide to move rightwards in the vertical sectional view of FIG. 9. Meanwhile, when the cover 110 moves upwards to return to its original position, the slide 120 is connected to the closure cams 112 which force the slide to move leftwards to its initial position.

Each of the contacts 170 includes a contact body 173, an elastic part 172, a contact lead 174, and a force fitting protrusion 176. The elastic part 172 extends upwards from the left side of the contact body 173, and has predetermined elasticity. The contact lead 174 extends downwards from the right side of the contact body 173 in such a way as to face the elastic part. The force fitting protrusion 176 prevents the contact 170 from being removed from the corresponding contact hole 141 of the socket body 140, thus keeping upper and lower positions of the contacts constant.

According to this embodiment, each contact 170 comprises a gold-plated copper alloy so as to improve its electrical characteristics, such as electrical conductivity. However, the present invention is not limited to the gold-plated copper alloy.

The contacts 170 will be described in detail later.

The BGA-type test and burn-in socket for ICs, according to the first embodiment of the present invention, will be described in detail with reference to FIGS. 11 to 18.

FIG. 11 is a detailed plan view of portion A of FIG. 8, illustrating the state where the socket cover 110 is not pressed, and FIG. 12 is a vertical sectional view taken along line X4-X4 of FIG. 11

A portion shown by oblique lines in FIG. 11, that is, a hatched portion represents the upper surface of the slide 120. This portion serves as an IC seating plane contacting the bottom (lower surface) of the IC, when the IC is loaded into the socket.

Each of the contacts 170 according to the first embodiment of the present invention is a single contact, that is, a contact having a single upper contact terminal 171. In order to enhance injection formability of the slide 120, space occupied by the contact through holes 124 is minimized.

Further, in order to allow the IC to be easily loaded into the socket without using an IC guide of a conventional socket, the ball guides 129 are provided on the upper surface of the slide 120.

In this case, each of the ball guides 129 has a rectangular shape. A ball insert hole 125 is formed in the corresponding ball guide 129 to allow each IC ball to be smoothly inserted into the ball guide 129. Further, a slide element 126 is provided between the bottom of each ball insert hole 125 and each contact through hole 124.

Each ball guide 129 comprises an outer wall of each ball insert hole 125, that is, a rectangular hole defined by horizontal walls 123 and vertical walls 127 provided on the upper surface of the slide 120. The ball guide 129 is constructed so that each IC ball can be smoothly inserted into the ball guide 129 when the IC is loaded into the socket.

Further, the vertical walls 127 are isolated from each other by the contact through holes 124. The moving range of each IC ball is restricted by the corners 128 of the vertical walls 127 which protrude into the interior of each ball guide 129.

Circles or semi-circles shown by the dotted lines in FIGS. 11 to 18 represent imaginary balls 102 of the loaded IC (hereinafter, referred to as "imaginary IC balls"). As shown in FIG. 11, the right side of each imaginary IC ball 120 is restricted by two corners 128 of the vertical walls 127, so that the imaginary IC ball 120 cannot move rightwards any further.

In this case, each upper contact terminal 171 is in close contact with the right side of the corresponding contact through hole 124, and is positioned to the right of the left edge of each imaginary IC ball 102.

In the state where each imaginary IC ball 102 is in close contact with two corners 128 of right vertical walls 127, the left surface of the imaginary IC ball 102 and the upper contact terminal 171 contact the corresponding IC ball.

FIG. 13 shows the state where the cover 110 is pressed downwards by the moving distance S, that is, the moment when the IC is loaded or unloaded. When the cover 110 is pressed down, the slide 120 moves rightwards, so that the upper contact terminal 171 moves from the right side to the left side in the corresponding contact through hole 124.

At this time, as shown in FIG. 14, each upper contact terminal 171 is located at a portion between neighboring vertical walls 127 of the slide 120.

Thus, the balls can be inserted into or removed from the rectangular ball guides 129 of the slide 120.

In such a state, the IC is loaded into or unloaded from the socket.

After the IC has been loaded into the socket, the cover 110 returns to its original state, as shown in FIGS. 15 and 16.

That is, when the IC is loaded into the upper surface of the slide 120 and the IC balls 2 are inserted into the corresponding ball guides 129 of the slide 120, the slide 120 moves leftwards to the initial position.

Thus, the left surface of each IC ball contacts the corresponding upper contact terminal 171.

At this time, as shown in FIG. 16, each contact 170 is elastically deformed. Further, the left surface of the slide element 126 is spaced apart from the right surface of the corresponding contact 170, so that the contact is brought into contact with the corresponding IC ball.

FIG. 17 shows the state where each upper contact terminal 171 contacts the central portion of the corresponding IC ball 2, when the IC ball 2 is received in the corresponding ball insert hole 125 which is the internal space of each ball guide 129 of the slide 120. FIG. 18 shows that each IC ball 2 may be inserted into the corresponding ball guide 129, even if the IC ball 2 is slightly misaligned with the central portion of the corresponding ball guide 129, when the IC is loaded on the upper surface of the slide 120.

Owing to the characteristic operation of the invention shown in FIG. 18, the IC, especially when dropped by an automatic IC loading machine (auto loader, auto sorter), may have a positional tolerance of about 0. 1 mm.

Hereinafter, contacts which may be applied to the first embodiment of this invention having the above-mentioned construction and characteristics will be described in detail with reference to FIGS. 19 to 24.

FIG. 19 is a side view of the contact, according to the first embodiment of the present invention, FIG. 20 is a front view of the contact, according to the first embodiment of the present invention, FIG. 21 is a side view of another contact which may be used in the first embodiment of the present invention, FIG. 22 is a front view of another contact which may be used in the first embodiment of the present invention, FIG. 23 is a side view of a further contact which may be used in the first embodiment of the present invention, and FIG. 24 is a front view of the further contact which may be used in the first embodiment of the present invention.

As shown in FIGS. 19 and 20, a contact 170 is bent such that an elastic part 172 and an upper contact part 171 are provided on the left side of a contact body 173 and a contact lead 174 is provided on the right side of the contact body 173 to face the elastic part and the upper contact part. Further, a force fitting protrusion 176 is provided at a predetermined position on the contact 170, and prevents the contact 170 from being undesirably removed from the corresponding contact hole 141 of the socket body 140.

Further, another example of the contact 170 is shown in FIGS. 21 and 22. In this case, a contact 270 has a U-shaped contact body 273. A force fitting protrusion 276 is provided at a predetermined position on the contact body 273 so as to prevent the contact 270 from being removed from the corresponding contact hole 141. Further, an elastic part 272 and an upper contact terminal 271 are provided on the upper portion of the contact body 273, and a contact lead 274 is provided on the lower portion of the contact body 273. The contact 270 is bent in a Z shape.

A further example of the contact 170 is shown in FIGS. 23 and 24. Like the contact 170, 270, a contact 370 has a contact body 373, with a force fitting protrusion 376 being provided on the contact body 373. An elastic part 372 and an upper contact terminal 371 are provided on the upper portion of the contact body 373, and a contact lead 374 is provided on the lower portion of the contact body 373. The contact 370 has no bent parts, but has a straight-line shape.

In order to compensate for reduced thickness compared to the above-mentioned contact 170, 270, the contact 370 is characterized in that a protrusion 277 is provided on the contact body 373.

FIGS. 25 and 26 show a BGA-type test and burn-in socket for ICs, according to a modification of the first embodiment of this invention. According to this modification, an IC guide 180 is further provided above the slide 120.

In this case, the IC guide 180 has a size which is slightly larger than an actual size defined by the width and length of an IC to be loaded. The IC guide 180 has an inclined surface in order to smoothly guide the IC.

Thus, if a user merely drops the IC over the socket, the IC is loaded into a predetermined position on the socket.

The operation of the BGA-type test and burn-in socket for ICs constructed as described above, according to the first embodiment of this invention, will be described below in detail with reference to FIGS. 27 to 29.

It is noted that FIGS. 27 to 29 represent the first to third steps of the operation.

FIGS. 27 to 29 are vertical sectional views showing the BGA-type test and burn-in socket for ICs, according to the first embodiment of the present invention.

First, at the first step representing the initial state of the socket shown in FIG. 27, the cover 110 is located at the uppermost position while being elastically supported by the cover springs 131. The slide 120 is elastically biased to the left of the drawing by the slide springs 132.

As shown in FIG. 27, the closure cams 112 of the cover 110 move the closure cam contact parts 122 of the slide 120, and support the closure cam contact parts 122 so that they do not move rightwards.

Meanwhile, the upper contact terminals 171 of the contacts 170, arranged and assembled in a predetermined manner by the socket body 140 and the stopper 150, are in close contact with the left surfaces of the slide elements 126 while having predetermined elastic potential.

FIGS. 11 and 12 show the positional relationship between the contact through holes 124, the ball guides 129, and the upper contact terminals 171, at the above-mentioned first step. As described above, the upper contact terminals 171 are in close contact with the right sides in the corresponding contact through holes 124, and the imaginary IC balls 102 are located at the rightmost positions in the corresponding ball guides 129.

That is, in the state where the imaginary IC balls 102 are in close contact with the corners 128 of the vertical walls 127, the upper contact terminals 171 are located to the right relative to the left edges of the imaginary IC balls 102, thus overlapping the imaginary IC balls 102.

Afterwards, when the IC is loaded into the socket, each contact is elastically deformed by the overlapping distance between the left side of each imaginary IC ball 102 and the corresponding upper contact terminal 171, thus contacting the imaginary IC ball 102.

Further, as shown in FIG. 10, the IC holders 130 are elastically closed by the holder springs 133.

In brief, when the cover 110 is located at an upper position, the closure cams 112 move the closure cam contact parts 122 of the slide 120 leftwards, and the upper contact terminals 171 are brought into close contact with the right sides in the contact through holes 124 which are formed in the upper surface of the slide 120. At this time, the IC holders 130 maintain a closed state.

Next, at the second step shown in FIG. 28, the cover 110 is pressed down by a pre-determined moving distance S. In such a state, the IC is loaded into or unloaded from the socket.

The transfer from the first step to the second step is conducted merely by pressing the cover 110 downwards. As the cover 110 moves downwards, the open cams 111 provided on the cover 110 push the open cam contact parts 121 of the slide 120 rightwards. Thus, the slide 120 is moved rightwards, and the left surface of each slide element 126 is separated from the corresponding upper contact terminal 171. Simultaneously, each upper contact terminal 171 is in close contact with the right surface of the slide element 126 which is near the left side of the upper contact terminal.

FIGS. 30 and 31 show the state where the upper contact terminals 171 are in close contact with the left sides in the contact through holes 124 of the slide 120, at the second step. At this time, each upper contact terminal 171 is positioned in a portion between neighboring vertical walls 127, and each ball guide 129 is ready to receive the corresponding IC ball therein. Further, as shown in FIG. 10, the holder rotating pins 113 press and rotate the IC holders 130, thus opening the IC holders 130.

At the second step, the cover 110 is pressed down. In such a state, the IC is loaded into the socket. In this case, even if each IC ball 2 is slightly misaligned with the central portion of the corresponding ball guide 129 when it is dropped, the circular portion of the IC ball 2 moves along the inner wall of the ball guide 129, so that the IC ball reaches the correct position.

In this case, each IC ball is constructed to be movable in the corresponding ball guide 129 to some extent. Further, in order to easily load or unload the IC or permit easy unloading after a burn-in test, each IC ball is constructed so that it does not contact the upper contact terminal 171 within a movable range.

In brief, when the cover 110 is pressed, the slide 120 moves rightwards, and the IC holders 130 are opened. Thus, the upper contact terminals 171 come into close contact with the left sides of the contact through holes 124, so that each upper contact terminal 171 is located in a portion between neighboring vertical walls 127. In such a state, when the IC is loaded on the upper surface of the slide 120, the balls of the IC are inserted into the corresponding ball insert holes 125 in the ball guides 129.

Finally, the third step shown in FIG. 29 is a step where the cover 110 returns to its original state. A downward force acting on the cover 110 is overcome by the elastic force of the cover springs 131.

In a detailed description, while the cover 110 returns to a position corresponding to about halfway back to the initial position, the holder rotating pins 113 of the cover 110, shown in FIG. 10, do not press the IC holders 130, but are spaced apart from the IC holders 130. The IC holders 130 are completely restored to their original states through the elastic restoring force of the holder springs 133, thus pressing the IC downwards.

At this time, the slide 120 is continuously subject to the elastic force of the slide springs 132. As the open cams 111 and the closure cams 112 of the cover 110 move upwards, the closure cam contact parts 122 of the slide 120 are moved leftwards by the closure cams 112. The slide 120 returns to a position corresponding to about halfway back to the initial position.

In this case, each upper contact terminal 171 is located in a middle position in the corresponding contact through hole 124 of the slide 120, and starts to contact the corresponding ball of the IC. Subsequently, while the cover 110 completely returns to the original position thereof, the closure cams 112 of the cover 110 push the closure cam contact parts 122 leftwards until the closure cam contact parts reach initial positions thereof.

Thus, when each ball of the IC is inserted into the ball insert hole 125 in the corresponding ball guide 129 of the slide 120, the IC moves leftwards along with the slide 120. Each ball of the IC pushes the corresponding upper contact terminal 171 leftwards. Thereby, the upper contact terminals 171 are brought into contact with the balls of the IC by the elastic restoring force caused by the elastic deformation.

FIGS. 15 and 16 show the state where the third step, that is, the operation of loading the IC into the socket has been completed.

Hereinbefore, the first to third steps of the operation of the BGA-type test and burn-in socket for ICs, according to the first embodiment of this invention, have been described. In brief, when the cover 110 is pressed down by a predetermined moving distance S, the slide 120 is moved rightwards by the open cams 111 of the cover 110. Thereby, the IC holders 130 are opened.

At this time, the upper contact terminals 171 are in close contact with the left sides in the contact through holes 124 of the slide 120. In such a state, the IC is loaded on the upper surface of the slide 120.

Thereafter, as the cover 110 returns to an original position thereof, the closure cams 112 of the cover 110 restore the slide 120 leftwards.

At this time, the IC holders 130 press the IC downwards. Next, as the IC balls are inserted into the corresponding ball insert holes 125 in the ball guides 129 of the slide 120, the IC moves leftwards. Subsequently, when the cover 110 has completely returned to an original position thereof, the IC balls contact the upper contact terminals 171 while being inserted into the corresponding ball guides 129 of the slide 120. Further, the contacts 170 come into contact with the IC balls while the contacts retain a predetermined elastic force.

The above-mentioned operation of the socket according to the first embodiment of this invention is basically identical with that of the following embodiments of the present invention.

According to the first embodiment of the present invention, the BGA-type test and burn-in socket for ICs is a soldering-type socket.

Mode for the Invention

Hereinbefore, the BGA-type test and burn-in socket for ICs, according to the first embodiment of the present invention, was described. Hereinafter, a BGA-type test and burn-in socket for ICs, according to the second embodiment of the present invention, will be described below with reference to FIG. 30.

FIG. 30 is a vertical sectional view of the BGA-type test and burn-in socket for ICs, according to the second embodiment of the present invention.

The second embodiment of the invention is different from the first embodiment in that a stopper 250 is provided on the upper portion of a socket body 240.

The socket body 240 includes a plurality of contact holes 241 which receive and support a plurality of contacts 170, and a plurality of positioning pins 242 which secure the socket to a predetermined position on a PCB.

In this case, the socket body 240 serves as a base for mounting a lead guide 160 on the lower portion of the socket body, and in addition, serves as a base for mounting the stopper 250, a slide 120 and a cover 110 on the upper portion of the socket body.

The lead guide 160 is provided under the socket body 240. Lead guide holes 161 are formed through the lead guide 160 to be positioned at ends of contact leads 174.

The lead guide 160 keeps contact leads 174 straight without bending the contact leads 174. When the socket is mounted on the PCB, the lead guide 160 helps precisely insert the contact leads 174 into through holes formed in the PCB. Further, when the socket is inserted into the PCB, the lead guide 160 enters the bottom of the socket body 240.

In the state where the contacts 170 are inserted into the contact holes 241 of the socket body 240, the stopper 250 functions to prevent the contacts 170 from being removed upwards from the socket body. The stopper 250 is assembled in a direction from the upper portion of the socket body 240 to the lower portion thereof. The stopper is provided with a plurality of holes 251 through which upper contact terminals 171 pass. The holes 251 function to support bodies 173 of the contacts 170.

The slide 120 is installed on the upper portion in the socket body 240, and is constructed to be movable within a predetermined range in a horizontal direction on the vertical sectional view of FIG. 13.

Further, the slide 120 is the component for loading an IC to be tested on the upper surface of the socket. A plurality of contact through holes 124 and a plurality of ball guides 129 are provided on the upper surface of the slide 120 at predetermined intervals. The upper contact terminals 171 movably pass through the contact through holes 124. Like the first embodiment, the ball guides 129 guide and receive the balls of the IC, although not shown in the drawing. Further, the slide 120 is provided with a plurality of open cam contact parts 121 and a plurality of closure cam contact parts 122 to correspond to open cams 111 and closure cams 112. Thereby, when the open cams 111 and the closure cams 112 of the cover 110 move up and down, the open cam contact parts and the closure cam contact parts contact the open cams 111 and the closure cams 112 to permit a sliding motion.

Further, a plurality of slide springs 132 is elastically supported between the slide 120 and the socket body 240. Thereby, when the open cams 111 and the closure cams 112 of the cover 110 move upwards, the slide springs 132 allow the slide to smoothly return to its original position.

In this embodiment, according to the number or pitch of the contact through holes 124 and the ball guides 129 arranged on the upper surface of the slide 120, the number and pitch of balls in the ball grid of an IC that may be loaded in the socket are determined. When the IC is loaded into the socket, the balls of the IC are inserted into ball insert holes 125 which are provided inside the ball guides 129 of the slide 120. Further, the bottom of the IC is seated on the upper surface of the slide 120.

Further, a plurality of IC holders 130 is rotatably assembled with the slide 120. The IC holders 130 are elastically supported by holder springs (not shown) of the first embodiment, which are provided between the IC holders and the slide 120. The IC holders 130 are constructed to be rotated by holder rotating pins (not shown) provided on the cover 110 when the cover 110 moves up and down, like the first embodiment.

As shown in FIG. 10 of the first embodiment, when the cover 110 is pressed downwards, the holder rotating pins 113 of the cover 110 rotate the IC holders 130 to open the IC holders. Thereby, the socket is ready to load the IC. After the IC is loaded into the socket, the cover 110 returns to its original position. The IC holders 130 press the IC downwards.

Further, the cover 110 is provided with the plurality of holder rotating pins 113. When the cover 110 moves downwards, the slide 120 is connected to the open cams 111, which force the slide to move rightwards in the vertical sectional view of FIG. 30. Meanwhile, when the cover 110 moves upwards to return to its original position, the slide 120 is connected to the closure cams 112 which force the slide to return to its initial position.

Like the contacts of the first embodiment, each of the contacts 170 is characterized in that one elastic part 172 and the upper contact terminal 171 extend upwards from the left side of the contact body 173. The contact lead 174 extends downwards from the right side of each contact body in such a way as to face the upper contact terminal 171. The force fitting protrusion 176 prevents the contact 170 from being removed from the corresponding contact hole 241 of the socket body 240, thus keeping upper and lower positions of the contacts constant.

According to this embodiment, each contact 170 comprises a gold-plated copper alloy so as to improve its electrical characteristics, such as electrical conductivity. However, the present invention is not limited to the gold-plated copper alloy.

Like the first embodiment, various kinds of contacts shown in FIGS. 19 to 24 may be adapted to the second embodiment. Since the operation of the socket according to the second embodiment is the same as that of the first embodiment, the operation of the second embodiment will not be described in detail.

Hereinbefore, the BGA-type test and burn-in socket for ICs, according to the second embodiment of the present invention, was described. Hereinafter, a BGA-type test and burn-in socket for ICs, according to the third embodiment of the present invention, will be described below with reference to FIG. 31.

FIG. 31 is a vertical sectional view of the BGA-type test and burn-in socket for ICs, according to the third embodiment of the present invention.

The third embodiment of the invention is different from the first and second embodiments in that it does not have a stopper.

When each of the contacts 170 provided in the socket 300 is inserted into a contact hole 341 formed in the upper portion of a socket body 340, a contact body 173 is force-fitted into the corresponding contact hole 341 via a force fitting protrusion 176 provided on the contact 170, like the contact adapted to the first and second embodiments.

The socket body 340 includes a plurality of contact holes 341 which receive and support a plurality of contacts 170, and a plurality of positioning pins 342 which secure the socket to a predetermined position on a PCB.

In this case, the socket body 340 serves as a base for mounting a lead guide 160 on the lower portion of the socket body, and in addition, serves as a base for mounting a slide 120 and a cover 110 on the upper portion of the socket body.

The lead guide 160 is provided under the socket body 340. The lead guide 160 is provided with a plurality of lead guide holes 161 so that ends of contact leads 174 pass through the corresponding lead guide holes.

Like the first and second embodiments, the lead guide 160 keeps contact leads 174 straight without bending the contact leads 174. When the socket is mounted on the PCB, the lead guide 160 helps precisely insert the contact leads 174 into through holes formed in the PCB.

Further, when the socket is inserted into the PCB, the lead guide 160 enters the bottom of the socket body 340.

The slide 120 is installed on the upper portion in the socket body 340, and is constructed to be movable within a predetermined range in a horizontal direction on the vertical sectional view of FIG. 14.

Further, the slide 120 is the component for loading an IC to be tested on the upper surface of the socket. A plurality of contact through holes 124 and a plurality of ball guides 129 are provided on the slide 120. The upper contact terminals 171 movably pass through the contact through holes 124. The ball guides 129 guide and receive the balls of the IC. Further, the slide 120 is provided with a plurality of open cam contact parts 121 and a plurality of closure cam contact parts 122 to correspond to open cams 111 and closure cams 112. Thereby, when the open cams 111 and the closure cams 112 of the cover 110 move up and down, the open cam contact parts and the closure cam contact parts contact the open cams 111 and the closure cams 112 to permit a sliding motion.

Further, a plurality of slide springs 132 is elastically supported between the slide 120 and the socket body 340. Thereby, when the open cams 111 and the closure cams 112 of the cover 110 move upwards, the slide springs 132 allow the slide to smoothly return to its original position.

In this embodiment, according to the number or pitch of the contact through holes 124 and the ball guides 129 arranged on the upper surface of the slide 120, the number and pitch of balls in the ball grid of the IC are determined. When the IC is loaded into the socket, the balls of the IC are inserted into ball insert holes 125 which are provided inside the ball guides 129 of the slide 120. Further, the bottom of the IC is seated on the upper surface of the slide 120.

Further, a plurality of IC holders 130 is rotatably assembled with the slide 120. Although not shown in the drawing, holder springs 133 are provided between the slide 120 and the IC holders 130, as in the above-mentioned embodiments.

In this case, when the cover 110 moves up and down, the slide 120 is rotated by the holder rotating pins 113 provided on the cover 110.

As in the above-mentioned embodiments, when the cover 110 is pressed downwards, the holder rotating pins 113 of the cover 110 open the IC holders 130. After the IC is loaded into the socket, the cover 110 returns to its original position, and the IC holders 130 continue pressing the IC downwards.

Meanwhile, the cover 110 is constructed to move up and down relative to the socket body 340 by the maximum moving distance S. Further, the cover 110 is elastically supported to the socket body 340 through a plurality of cover springs 131.

Further, the cover 110 is provided with the holder rotating pins 113. When the cover 110 moves downwards, the slide 120 is connected to the open cams 111, which force the slide to move rightwards in the vertical sectional view of FIG. 31.

Meanwhile, when the cover 110 moves upwards to return to its original position, the slide 120 is connected to the closure cams 112 which force the slide to move leftwards to its initial position.

Like the above-mentioned embodiments, each of the contacts 170 includes an elastic part 172, an upper contact terminal 171, and a force fitting protrusion 173.

According to this embodiment, each contact 170 comprises a gold-plated copper alloy so as to improve its electrical characteristics, such as electrical conductivity. However, the present invention is not limited to the gold-plated copper alloy.

The third embodiment of this invention may receive various kinds of contacts shown in FIGS. 19 to 24. Since the operation of the third embodiment is equal to that of the above-mentioned embodiments, it is omitted herein.

Hereinbefore, the BGA-type test and burn-in socket for ICs, according to the third embodiment of the present invention, was described. Hereinafter, a BGA-type test and burn-in socket for ICs, according to the fourth embodiment of the present invention, will be described below with reference to FIGS. 32 and 33.

FIG. 32 is a plan view of a BGA-type test and burn-in socket for ICs, according to the fourth embodiment of the present invention, and FIG. 33 is a vertical sectional view taken along line X8-X8 of FIG. 32.

The sockets of the above-mentioned embodiments are soldered to a PCB, whereas the socket of the fourth embodiment is assembled with a PCB using screws. The socket is a contact socket which is characterized in that a contact lead is elastically deformed and contacts a contact pad of a PCB while having a predetermined elastic force, or a compression mounting socket.

According to the fourth embodiment, a socket body 440 includes a plurality of contact holes 441, a plurality of positioning pins 442, and a plurality of screw holes 443. The contact holes receive and support contacts which are inserted in a direction from the lower portion of the socket body to the upper portion thereof. The positioning pins secure the socket body to a predetermined position on a PCB. Screws are fitted into the screw holes to fasten the socket to the PCB.

In this case, the socket body 440 serves as a base for mounting a lead guide 160 on the lower portion of the socket body, and in addition, serves as a base for mounting a slide 120 and a cover 110 on the upper portion of the socket body.

The lead guide 460 is provided under the socket body 440. The lead guide 460 is provided with a plurality of lead guide holes 461 so that ends of contact leads 474 movably pass through the corresponding lead guide holes. Further, a plurality of guide pins 462 is provided on the lower surface of the lead guide 460, and guide the contact leads 474 so that they precisely contact the contact pads of the PCB, when the socket is mounted on the PCB.

The lead guide 460 keeps contact leads 474 straight without bending the contact leads 474. When the socket is mounted on the PCB, the lead guide functions to make the contact leads 474 be in precise contact with contact pads of the PCB. Further, when the socket is mounted on the PCB, the lead guide is inserted into the lower surface of the socket body 440.

The slide 120 is installed on the upper portion in the socket body 440, and is constructed to be movable within a predetermined range in a horizontal direction on the vertical sectional view of FIG. 33.

Further, the slide 120 is the component for loading an IC to be tested on the upper surface of the socket. A plurality of contact through holes 124 and a plurality of ball guides 129 are provided on the slide 120. The upper contact terminals 471 movably pass through the contact through holes 124. The ball guides 129 guide and receive the balls of the IC. Further, the slide 120 is provided with a plurality of open cam contact parts 121 and a plurality of closure cam contact parts 122 to correspond to open cams 111 and closure cams 112 of the cover 110. The open cam contact parts and the closure cam contact parts contact the open cams 111 and the closure cams 112 to permit a sliding motion.

Further, like the above-mentioned embodiments, a plurality of slide springs 132 is elastically supported between the slide 120 and the socket body 440. Thereby, when the open cams 111 and the closure cams 112 of the cover 110 move upwards, the slide springs 132 allow the slide 120 to smoothly return to its original position.

In this embodiment, according to the number or pitch of the contact through holes 124 and the ball guides 129 arranged on the upper surface of the slide 120, the number and pitch of balls in the ball grid of the IC are determined. When the IC is loaded into the socket, the balls of the IC are inserted into ball insert holes 125 which are provided inside the ball guides 129 of the slide 120. Further, the bottom of the IC is seated on the upper surface of the slide 120.

Further, according to this embodiment, an IC guide may also be provided above the slide 120 to guide the IC, as in the prior art.

Meanwhile, a plurality of IC holders 130 is rotatably assembled with the slide 120. The IC holders 130 are elastically supported by holder springs 133 which are provided between the slide 120 and the IC holders 130. When the cover 110 moves up and down, the IC holders are rotated by the holder rotating pins 113 provided on the cover 110.

As in the above-mentioned embodiments, when the cover 110 is pressed downwards, the holder rotating pins 113 of the cover 110 rotate to open the IC holders 130.

Thereby, the socket is ready to load the IC. After the IC is loaded into the socket, the cover 110 returns to its original position. At this time, the IC holders 130 continue pressing the IC downwards.

In this case, the cover 110 is constructed to move up and down relative to the socket body 440 by the maximum moving distance S. Further, the cover 110 is elastically supported to the socket body 440 through a plurality of cover springs 131.

Further, the cover 110 is provided with the plurality of holder rotating pins 113. When the cover 110 moves downwards, the slide 120 is connected to the open cams 111, which force the slide to move rightwards in the vertical sectional view of FIG. 33. Further, when the cover 110 moves upwards to return to its original position, the slide 120 is connected to the closure cams 112 which force the slide to move leftwards to its initial position.

Hereinafter, contacts which may be applied to the fourth embodiment of the invention having the above-mentioned construction and characteristics will be described in detail with reference to FIGS. 34 to 39.

FIG. 34 is a side view of a contact, according to the fourth embodiment of the present invention, FIG. 35 is a front view of the contact, according to the fourth embodiment of the present invention, FIG. 36 is a side view of another contact which may be used in the fourth embodiment of the present invention, FIG. 37 is a front view of another contact which may be used in the fourth embodiment of the present invention, FIG. 38 is a side view of a further contact which may be used in the fourth embodiment of the present invention, and FIG. 39 is a front view of the further contact which may be used in the fourth embodiment of the present invention.

Contacts shown in FIGS. 34 to 39 are contact-type contacts each having an arc-shaped bent part which is provided above a contact lead, unlike the contacts applied to the above-mentioned embodiments.

As shown in FIGS. 34 and 35, a contact 470 has at a central portion thereof a contact body 473. An elastic part 472 and an upper contact terminal 471 extend upwards from the left side of the contact body 473. A lead elastic part 475 having an arc-shaped bent part and a contact lead 474 extend downwards from the right side of the contact body 473 in such a way as to face the elastic part and the upper contact terminal. A force fitting protrusion 476 is provided at a predetermined position on the contact body so as to prevent the contact 470 from being removed from the contact hole 441 of the socket body 440.

A contact 570 shown in FIGS. 36 and 37 has at a central portion thereof a contact body 573. A force fitting protrusion 576 is provided on the lower portion of the contact body 573 so as to prevent the contact 570 from being removed from the contact hole 441.

Further, an elastic part 572 and an upper contact terminal 571 are provided on the upper portion of the contact body 573. A contact lead 574 and a lead elastic part 575, which is bent in an arc shape, are provided on the lower portion of the contact body 573.

A contact 670 shown in FIGS. 38 and 39 has at a central portion thereof a contact body 673. A force fitting protrusion 676 is provided at a predetermined position on the contact body 673 so as to prevent the contact 670 from being removed from the contact hole 441.

Further, an elastic part 672 and an upper contact terminal 671 are provided on the upper portion of the contact body 673. A contact lead 674 and a lead elastic part 675, which is bent in an arc shape, are provided on the lower portion of the contact body 673.

In this case, the contact body 673 has the same thickness as the elastic part 672, as shown in the side view of FIG. 38. In order to compensate for the thickness, a screw-head-shaped protrusion 677 is provided at a predetermined position on the contact body.

In this embodiment, the contact 470, 570, 670 comprises a gold-plated copper alloy so as to improve electrical characteristics, such as electrical conductivity. However, the present invention is not limited to the gold-plated copper alloy.

Since the operation of the fourth embodiment is the same as the above-mentioned embodiments, the description of the operation will be omitted herein.

Hereinbefore, the BGA-type test and burn-in socket for ICs, according to the fourth embodiment of the present invention, was described. Hereinafter, a BGA-type test and burn-in socket for ICs, according to the fifth embodiment of the present invention, will be described below with reference to FIGS. 40 to 42.

FIG. 40 is a plan view of a BGA-type test and burn-in socket for ICs, according to the fifth embodiment of the present invention, FIG. 41 is a vertical sectional view taken along line X9-X9 of FIG. 40, and FIG. 42 is a vertical sectional view taken along line X10-X10 of FIG. 40.

The fifth embodiment of the invention, shown in FIGS. 40 to 42, provides a socket which may receive 1000 or more contacts. The socket is characterized in that it operates a slide 520 by means of levers 590, as shown in FIG. 42.

The socket body 540 of the fifth embodiment includes a plurality of positioning pins 542 which secure the socket to a predetermined position on a PCB, and a plurality of contact holes 541 which receive and support a plurality of contacts 170.

In this case, the socket body 540 serves as a base for mounting a stopper 550 and a lead guide 560 on the lower portion of the socket body, and in addition, serves as a base for mounting the slide 520 and a cover 510 on the upper portion of the socket body.

The lead guide 160 is provided under the socket body 540. A plurality of lead guide holes 561 is formed through the lead guide 560 such that ends of contact leads 174 movably pass through the lead guide holes.

The lead guide 560 keeps the contact leads 174 straight without deforming the contact leads 174. When the socket is mounted on the PCB, the lead guide 560 helps precisely insert the contact leads 174 into through holes formed in the PCB. Further, when the socket is inserted into the PCB, the lead guide enters the bottom of the socket body 540.

In the state where the contacts 170 are inserted into the contact holes 541 of the socket body 540, the stopper 550 functions to prevent the contacts from being removed downwards from the socket body. The stopper is provided with a plurality of holes 551 through which upper contact terminals 171 pass. The holes 551 function to support bodies 173 of the contacts 170.

The slide 520 is installed on the upper portion in the socket body 540, and is constructed to be movable within a predetermined range in a horizontal direction on the vertical sectional view of FIG. 41.

Further, the slide 520 is the component for loading an IC to be tested on the upper surface of the socket. A plurality of contact through holes 524 and a plurality of ball guides 129 are provided on the upper surface of the slide 520. The upper contact terminals 171 movably pass through the contact through holes 124. As in the first and second embodiments, the ball guides 129 guide and receive the balls of the IC, although not shown in the drawing.

Further, a plurality of slide springs 532 is elastically supported between the slide 520 and the socket body 540 in order to allow the slide 520 to smoothly return to its original position.

In this embodiment, according to the number or pitch of the contact through holes 524 and the ball guides 129 arranged on the upper surface of the slide 520, the number and pitch of balls in the ball grid of an IC that may be loaded in the socket are determined. When the IC is loaded into the socket, the balls of the IC are inserted into ball insert holes 125 which are provided inside the ball guides 529 of the slide 520. Further, the bottom of the IC is seated on the upper surface of the slide 520.

According to this embodiment, the slide 520 may further include an IC guide 580 to guide an IC, when the IC is loaded on the slide.

Further, a plurality of IC holders 130 is rotatably assembled with the slide 520. The IC holders 130 are elastically supported by holder springs 133 which are provided between the slide 520 and the IC holders 130. When the cover 510 moves up and down, the IC holders 130 are rotated by the holder rotating pins 513 provided on the cover 110.

When the cover 510 moves vertically, like the above-mentioned embodiments, the levers 590 move the slide 520 horizontally. One side of each lever 590 is rotatably secured to the socket body via a rotary hole 593 and a rotary shaft 594. The upper portion of the rotary hole 593 is secured to the slide 520 via a moving hole 591 and a moving shaft 592.

Further, each lever 590 is elastically supported by a lever spring 533 provided between the lower portion of the other side of the lever and the socket body 540. A semicircular spring guide protrusion 596 is provided on the lower portion of the other side of the lever 590. Further, a semicircular push part 595 is provided on the upper portion of the spring guide protrusion 596.

When the cover 510 is pressed down, the push part 595 of each lever 590 having the above-mentioned construction is pressed down, and pushes the slide 520, secured via the moving hole 591 and the moving shaft 592, rightwards.

In such a state, the IC is loaded into the socket, like the first embodiment. After the IC has been loaded, the cover 510 returns to its original position. Simultaneously, the lever 590 returns to its original position through the elastic restoring force of the lever spring 533. Thus, the slide 520, coupled to the lever 590, also returns to its original position.

Like the first embodiment, the fifth embodiment of the invention can receive various contacts shown in FIGS. 19 to 24. Since the operation of the fifth embodiment remains the same as the above-mentioned embodiments except that the slide 520 is moved leftwards and rightwards by the levers 590, the operation of the fifth embodiment will not be described in detail herein.

The present invention provides a socket mainly for testing a BGA-type IC. However, the present invention may be variously applied to other types of ICs. Moreover, this invention may be applied to a socket for loading new types of ICs which may be invented in the future.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

INDUSTRIAL APPLICABILITY

The present invention has the following effects, as described in the above-mentioned embodiments.

First, a contact has a single terminal, thus dramatically reducing the material costs and permitting an easier assembly of the contact.

Second, the space occupied by contact through holes formed in a slide is minimized, so that an injection molding process for a BGA-type socket having more balls is possible, as compared to the prior art.

Third, a slide is moved by pressing a cover downwards. However, the present invention is constructed so that a slide element does not push an upper contact terminal, but the slide element moves away from the upper contact terminal, unlike the prior art, thus minimizing the force required to move the slide and the force required to operate the cover. Thereby, even when the number of contacts is 900 (30×30) or more, the socket may be operated using a low operating force.

Fourth, unlike the prior art, stress is not directly applied to the contact by the slide element, thus increasing the life span of the socket so as to be semi-permanent, compared to the prior art.

Fifth, a function of guiding IC balls is incorporated into a slide, in consideration of the mechanical accuracy of an automatic IC loading machine (auto loader, auto sorter), which is widely used, thus allowing an IC to be precisely loaded into the socket without an IC guide.

The invention claimed is:
1. A BGA-type test and burn-in socket for integrated circuits (ICs), comprising:
a plurality of contacts, each of the contacts comprising:
only a single upper contact terminal having a straight-line shape and contacting a ball of an IC;
an elastic part that is elastically deformed;
a contact body; and
a contact lead soldered into a through hole of a printed circuit board (PCB);
a socket body, comprising:
a plurality of contact holes to receive and support the contacts;
a plurality of positioning pins provided on a lower portion of the socket body to secure the socket body to a predetermined position on the PCB;

a stopper provided on the lower portion of the socket body to receive and support the contact body;

a lead guide downwardly movably provided on the lower portion of the socket body, protecting the contact lead, and guiding a position of the contact lead; and a slide and a cover provided on an upper portion of the socket body;

the cover elastically biased to the socket body via a plurality of cover springs and moving downwards by a predetermined distance, the cover comprising:

a plurality of open cams and closure cams to move the slide horizontally; and a plurality of holder rotating pins to rotate IC holders;

the slide elastically biased to the socket body via a plurality of slide springs such that the slide smoothly restores an original position thereof, and elastically supported via holder springs to rotate the IC holders upwards and downwards, the slide comprising:

a plurality of open cam contact parts contacting the open cams of the cover, when the cover is pressed down;

a plurality of closure cam contact parts contacting the closure cams of the cover, when the cover moves upwards to restore an original position thereof;

a plurality of contact through holes through which the contacts movably pass; and a plurality of rectangular ball guides to receive associated balls of the IC; and a plurality of IC holders to move downwards, thus pressing an upper portion of the IC, when the cover is pressed downwards to push the holder rotating pins of the cover, whereby, when the cover moves downwards by a predetermined distance, the slide is moved rightwards by the open cams of the cover and the IC holders are opened, so that the upper contact terminal of each of the contacts is in close contact with a left side in an associated contact through hole, and, after the IC is seated on an upper surface of the slide, the cover restores the original position thereof, so that the closure cams move the slide leftwards and the IC holders press the IC downwards, and thereafter, the IC ball received in a ball insert hole of each of the ball guides moves to the left together with the slide, and, when the cover has completely restored the original position thereof, the IC ball comes into contact with the upper contact terminal of each of the contacts while being received in the ball guide.

2. The BGA-type test and burn-in socket as set forth in claim 1, wherein the slide further comprises:

a plurality of IC guides to allow the ball of the IC loaded on the slide to be easily inserted into each of the contact through holes.

3. The BGA-type test and burn-in socket as set forth in claim 1, wherein at least one of the contacts, of the plurality of contacts, is formed in a shape defined as comprising:

an elastic part having predetermined elasticity and an upper contact terminal that extend upwards from a U-shaped contact body provided on a central portion of the contact;

a contact lead extending downwards from the U-shaped contact body and coming into contact with the PCB, the contact lead including an angled portion from the U-shaped contact body such that the upper contact terminal extending upwards from the U-shaped contact body and the contact lead extending downwards from the U-shaped contact body are substantially parallel elements extending along substantially different parallel planes; and a force fitting protrusion provided on a predetermined portion of the U-shaped contact body, wherein the force fitting protrusion prevents the removal of the contact through the contact hole on the socket body.

4. A BGA-type test and burn-in socket for integrated circuits (ICs), comprising:

a plurality of contacts, each of the contacts comprising:

only a single upper contact terminal having a straight-line shape and contacting a ball of an IC;

an elastic part that is elastically deformed;

a contact body; and a contact lead soldered into a through hole of a printed circuit board (PCB);

a socket body, comprising:

a plurality of contact holes to receive and support the contacts;

a plurality of positioning pins provided on a lower portion of the socket body to secure the socket body to a predetermined position on the PCB;

a lead guide downwardly movably provided on the lower portion of the socket body, protecting the contact lead, and guiding a position of the contact lead; and a stopper, a slide, and a cover that are provided on an upper portion of the socket body, the stopper receiving and supporting the contact body;

the cover elastically biased to the socket body via a plurality of cover springs and moving downwards by a predetermined distance, the cover comprising:

a plurality of open cams and closure cams to move the slide horizontally; and a plurality of holder rotating pins to rotate IC holders;

the slide elastically biased to the socket body via a plurality of slide springs such that the slide smoothly restores an original position thereof, and elastically supported via holder springs to rotate the IC holders upwards and downwards, the slide comprising:

a plurality of open cam contact parts contacting the open cams of the cover, when the cover is pressed down;

a plurality of closure cam contact parts contacting the closure cams of the cover, when the cover moves upwards to restore an original position thereof;

a plurality of contact through holes through which the contacts movably pass; and a plurality of rectangular ball guides to receive associated balls of the IC; and a plurality of IC holders to move downwards, thus pressing an upper portion of the IC, when the cover is pressed downwards to push the holder rotating pins of the cover, whereby, when the cover moves downwards by the predetermined distance, the slide is moved rightwards by the open cams of the cover and the IC holders are opened, so that the upper contact terminal of each of the contacts is in close contact with a left side in an associated contact through hole, and, after the IC is seated on an upper surface of the slide, the cover restores the original position thereof, so that the closure cams move the slide leftwards and the IC holders press the IC downwards, and thereafter, the IC ball received in a ball insert hole of each of the ball guides is moved to the left together with the slide, and, when the cover has completely restored the original position thereof, the IC ball comes into contact with the upper contact terminal of each of the contacts while being received in the ball guide.

5. The BGA-type test and burn-in socket as set forth in claim 4, wherein the slide further comprises:
  a plurality of IC guides to allow the ball of the IC loaded on the slide to be easily inserted into each of the contact through holes.

6. The BGA-type test and burn-in socket as set forth in claim 4, wherein at least one of the contacts, of the plurality of contacts, is formed in a shape defined as comprising:
  an elastic part having predetermined elasticity and an upper contact terminal that extend upwards from a U-shaped contact body provided on a central portion of the contact;
    a contact lead extending downwards from the U-shaped contact body and coming into contact with the PCB, the contact lead including an angled portion from the U-shaped contact body such that the upper contact terminal extending upwards from the U-shaped contact body and the contact lead extending downwards from the U-shaped contact body are substantially parallel elements extending along substantially different parallel planes; and
    a contact lead extending downwards from the contact body and coming into contact with the PCB; and
    a force fitting protrusion provided on a predetermined portion of the contact body.

7. A BGA-type test and burn-in socket for integrated circuits (ICs), comprising:
  a plurality of contacts, each of the contacts comprising:
    only a single upper contact terminal having a straight-line shape and contacting a ball of an IC;
    an elastic part that is elastically deformed;
    a contact body; and
    a contact lead soldered into a through hole of a printed circuit board (PCB);
  a socket body, comprising:
    a plurality of contact holes to receive and support the contacts;
    a plurality of positioning pins provided on a lower portion of the socket body to secure the socket body to a predetermined position on the PCB;
    a lead guide downwardly movably provided on the lower portion of the socket body, protecting the contact lead, and guiding a position of the contact lead; and
    a slide and a cover that are provided on an upper portion of the socket body;
  the cover elastically biased to the socket body via a plurality of cover springs and moving downwards by a predetermined distance, the cover comprising:
    a plurality of open cams and closure cams to move the slide horizontally; and
    a plurality of holder rotating pins to rotate IC holders;
  the slide elastically biased to the socket body via a plurality of slide springs such that the slide smoothly restores an original position thereof, and elastically supported via holder springs to rotate the IC holders upwards and downwards, the slide comprising:
    a plurality of open cam contact parts contacting the open cams of the cover, when the cover is pressed down;
    a plurality of closure cam contact parts contacting the closure cams of the cover when the cover moves upwards to restore an original position thereof;
    a plurality of contact through holes through which the contacts movably pass; and
    a plurality of rectangular ball guides to receive associated balls of the IC; and
    a plurality of IC holders to move downwards, thus pressing an upper portion of the IC, when the cover is pressed downwards to push the holder rotating pins of the cover,
  whereby, when the cover moves downwards by a predetermined distance, the slide is moved rightwards by the open cams of the cover and the IC holders are opened, so that the upper contact terminal of each of the contacts is in close contact with a left side in an associated contact through hole, and, after the IC is seated on an upper surface of the slide, the cover restores the original position thereof, so that the closure cams move the slide leftwards and the IC holders press the IC downwards, and thereafter, the IC ball received in a ball insert hole of each of the ball guides moves to the left together with the slide, and, when the cover has completely restored the original position thereof, the IC ball comes into contact with the upper contact terminal of each of the contacts while being received in the ball guide.

8. The BGA-type test and burn-in socket as set forth in claim 7, wherein the slide further comprises:
  a plurality of IC guides to allow the ball of the IC loaded on the slide to be easily inserted into each of the contact through holes.

9. The BGA-type test and burn-in socket as set forth in claim 7, wherein at least one of the contacts, of the plurality of contacts, is formed in a shape defined as comprising:
  an elastic part having predetermined elasticity and an upper contact terminal that extend upwards from a U-shaped contact body provided on a central portion of the contact;
    a contact lead extending downwards from the U-shaped contact body and coming into contact with the PCB, the contact lead including an angled portion from the U-shaped contact body such that the upper contact terminal extending upwards from the U-shaped contact body and the contact lead extending downwards from the U-shaped contact body are substantially parallel elements extending along substantially different parallel planes; and
    a force fitting protrusion provided on a predetermined portion of the contact body.

10. A BGA-type test and burn-in socket for integrated circuits (ICs), comprising:
  a plurality of contacts, each of the contacts comprising:
    only a single upper contact terminal having a straight-line shape and contacting a ball of an IC;
    an elastic part that is elastically deformed;
    a contact body;
    a lead elastic part; and
    a contact lead elastically contacting a contact pad of a PCB due to elastic deformation of the lead elastic part;
  a socket body, comprising:
    a plurality of contact holes to receive and support the contacts;
    a plurality of positioning pins provided on a lower portion of the socket body to secure the socket body to a predetermined position on the PCB;
    a plurality of screw holes used to fasten the socket to the PCB via screws;
    a plurality of guide pins provided on the lower portion of the socket body to protect the contact leads and guide positions of the contact leads, and locating the contact leads at predetermined positions, when the socket is mounted on the PCB;
    a lead guide downwardly movably provided on the lower portion of the socket body; and a slide and a cover provided on an upper portion of the socket body;
the cover elastically biased to the socket body via a plurality of cover springs and moving downwards by a predetermined distance; the cover comprising:
   a plurality of open cams and closure cams to move the slide horizontally; and
   a plurality of holder rotating pins to rotate IC holders;
the slide elastically biased to the socket body via a plurality of slide springs such that the slide smoothly restores an original position thereof, and elastically supported via holder springs to rotate the IC holders upwards and downwards, the slide comprising:
   a plurality of open cam contact parts contacting the open cams and the closure cams of the cover, when the cover is pressed down;
   a plurality of closure cam contact parts contacting the closure cams of the cover, when the cover moves upwards to restore an original position thereof;
   a plurality of contact through holes through which the contacts movably pass; and
   a plurality of rectangular ball guides to receive an associated ball of the IC; and
a plurality of IC holders to move downwards, thus pressing an upper portion of the IC, when the cover is pressed downwards to push the holder rotating pins of the cover,
whereby, when the cover moves downwards by a predetermined distance, the slide is moved rightwards by the open cams of the cover and the IC holders are opened, so that the upper contact terminal of each of the contacts is in close contact with a left side in an associated contact through hole, and, after the IC is seated on an upper surface of the slide, the cover restores the original position thereof, so that the closure cams move the slide leftwards and the IC holders press the IC downwards, and thereafter, the IC ball received in a ball insert hole of each of the ball guides moves to the left together with the slide, and, when the cover has completely restored the original position thereof, the IC ball comes into contact with the upper contact terminal of each of the contacts while being received in the ball guide.

11. The BGA-type test and burn-in socket as set forth in claim 10, wherein the slide further comprises:
a plurality of IC guides to allow the ball of the IC loaded on the slide to be easily inserted into each of the contact through holes.

12. The BGA-type test and burn-in socket as set forth in claim 10, wherein at least one of the contacts, of the plurality of contacts, comprises one or more of the following:
   a first contact, comprising:
      an elastic part having predetermined elasticity and an upper contact terminal that extend upwards from a left side of a contact body provided on a central portion of the first contact;
      a lead elastic part and a contact lead that extend downwards from a right side of the contact body, the lead elastic part having an arc-shaped bent part, and the contact lead coming into contact with the PCB; and
      a force fitting protrusion provided on a predetermined portion of the contact body;
   a second contact, comprising:
      an elastic part having predetermined elasticity and an upper contact terminal that extend upwards from a U-shaped contact body provided on a central portion of the second contact;
      a lead elastic part and a contact lead that extend downwards from the contact body, the lead elastic part having an arc-shaped bent part, and the contact lead coming into contact with the PCB; and
      a force fitting protrusion provided on a predetermined portion of the contact body; or
   a third contact, comprising:
      an elastic part having predetermined elasticity and an upper contact terminal that extend upwards from a contact body provided on a central portion of the third contact;
      a lead elastic part and a contact lead that extend downwards from the contact body, the lead elastic part having an arc-shaped bent part, and the contact lead coming into contact with the PCB; and
      a force fitting protrusion and a screw-head-shaped thickness compensation protrusion that are provided on predetermined portions of the contact body.

13. A BGA-type test and burn-in socket for integrated circuits (ICs), comprising:
a plurality of contacts, each of the contacts comprising:
   only a single upper contact terminal having a straight-line shape and contacting a ball of an IC;
   an elastic part that is elastically deformed;
   a contact body; and
   a contact lead soldered into a through hole of a printed circuit board (PCB);
a socket body, comprising:
   a plurality of contact holes to receive and support the contacts;
   a plurality of positioning pins provided on a lower portion of the socket body to secure the socket body to a predetermined position on the PCB;
   a plurality of rotary holes and rotary shafts used to rotatably mount a plurality of levers to the socket body;
   a stopper provided on the lower portion of the socket body to receive and support the contact body;
   a lead guide downwardly movably provided on the lower portion of the socket body, protecting the contact lead, and guiding a position of the contact lead; and
   a slide and a cover provided on an upper portion of the socket body;
a plurality of levers functioning to move the slide horizontally, a first side of each of the levers being rotatably mounted to the socket body via the rotary holes and rotary shafts, with an upper portion of the first side being mounted to the slide via a moving hole and a moving shaft, each of the levers comprising:
   a lever spring elastically supported between a lower portion of a second side of each of the levers and the socket body;
   a semicircular spring guide protrusion provided on the lower portion of the second side of each of the levers to hold the lever spring; and
   a semicircular push part provided on an upper portion of the second side of each of the levers;
the cover elastically biased to the socket body via a plurality of cover springs, and moving downwards by a predetermined distance to press the push part of the lever downwards, thus operating the lever, the cover comprising:
   a plurality of holder rotating pins to rotate IC holders;
the slide elastically supported via holder springs to rotate the IC holders upwards and downwards, and elastically biased to the socket body via a plurality of slide springs such that the slide smoothly restores an original position thereof, and assembled with each of the levers via the moving hole and the moving shaft to be moved horizontally, the slide comprising:

a plurality of contact through holes through which the contacts movably pass; and a plurality of rectangular ball guides to receive an associated ball of the IC; and a plurality of IC holders to move downwards, thus pressing an upper portion of the IC, when the cover is pressed downwards to push the holder rotating pins of the cover, whereby, when the cover moves downwards by a predetermined distance, the push part of each lever is pressed down, the holder rotating pin moves downwards, the IC holder is opened, and the slide mounted to the socket body via the moving hole and the moving shaft moves rightwards, so that the upper contact terminals of the contacts are in close contact with left sides of the contact through holes, and, after the IC is seated on an upper surface of the slide, the cover restores the original position thereof, so that the lever returns to an original position thereof by a restoring force of the lever spring, and the IC ball received in a ball insert hole of each of the ball guides moves leftwards together with the slide, and, when the cover has completely restored an original position thereof, the IC ball comes into contact with the upper contact terminal of each of the contacts while being received in the ball guide.

14. The BGA-type test and burn-in socket as set forth in claim 13, wherein the slide further comprises:

a plurality of IC guides to allow the ball of the IC loaded on the slide to be easily inserted into each of the contact through holes.

15. The BGA-type test and burn-in socket as set forth in claim 13, wherein at least one of the contacts, of the plurality of contacts, is formed in a shape defined as comprising:

an elastic part having predetermined elasticity and an upper contact terminal that extend upwards from a U-shaped contact body provided on a central portion of the contact;

a contact lead extending downwards from the contact body and coming into contact with the PCB, the contact lead including an angled portion from the U-shaped contact body such that the upper contact terminal extending upwards from the U-shaped contact body and the contact lead extending downwards from the U-shaped contact body are substantially parallel elements extending along substantially different parallel planes; and a force fitting protrusion provided on a predetermined portion of the contact body.

16. The BGA-type test and burn-in socket as set forth in claim 1, 4, 7, or 10 wherein at least one of the contacts, of the plurality of contacts, comprises:

a contact, comprising:

an elastic part having predetermined elasticity and an upper contact terminal that extend upwards from a left side of a contact body provided on a central portion of the contact;

a contact lead extending downwards from a right side of the contact body and coming into contact with the PCB; and a force fitting protrusion provided on a predetermined portion of the contact body; or a straight line-shaped contact having no bent parts, comprising:

an elastic part having predetermined elasticity and an upper contact terminal that extend upwards from a contact body provided on a central portion of the contact;

a contact lead extending downwards from the contact body and coming into contact with the PCB; and a force fitting protrusion and a thickness compensation protrusion that are provided on predetermined portions of the contact body.

* * * * *